(12) United States Patent
Choi et al.

(10) Patent No.: US 12,219,838 B2
(45) Date of Patent: Feb. 4, 2025

(54) DISPLAY DEVICE

(71) Applicant: Samsung Display Co., Ltd., Yongin-Si (KR)

(72) Inventors: Yoon Sun Choi, Hwaseong-si (KR); Seong Ryong Lee, Hwaseong-si (KR); Seung-Hwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/229,120

(22) Filed: Aug. 1, 2023

(65) Prior Publication Data
US 2023/0380235 A1    Nov. 23, 2023

Related U.S. Application Data

(63) Continuation of application No. 17/670,103, filed on Feb. 11, 2022, now Pat. No. 11,758,783.

(30) Foreign Application Priority Data

Jun. 29, 2021    (KR) .................. 10-2021-0084787

(51) Int. Cl.
| | |
|---|---|
| *H10K 59/131* | (2023.01) |
| *G06F 3/041* | (2006.01) |
| *G06F 3/044* | (2006.01) |
| *H10K 50/844* | (2023.01) |
| *H10K 59/124* | (2023.01) |
| *H10K 59/40* | (2023.01) |
| *H10K 71/00* | (2023.01) |
| *H10K 59/12* | (2023.01) |

(52) U.S. Cl.
CPC ..... *H10K 59/1315* (2023.02); *G06F 3/04164* (2019.05); *G06F 3/0445* (2019.05); *H10K 50/844* (2023.02); *H10K 59/124* (2023.02); *H10K 59/40* (2023.02); *H10K 71/00* (2023.02); *G06F 2203/04111* (2013.01); *G06F 2203/04112* (2013.01); *H10K 59/1201* (2023.02)

(58) Field of Classification Search
CPC .. H10K 59/1315; H10K 59/40; H10K 59/124; H10K 50/844; G06F 3/0445; G06F 3/04164
See application file for complete search history.

(56) References Cited

U.S. PATENT DOCUMENTS

| | | |
|---|---|---|
| 9,553,156 B2 | 1/2017 | Kim et al. |
| 9,711,588 B2 | 7/2017 | Han et al. |
| 11,316,001 B2 | 4/2022 | Cho et al. |
| 2021/0028241 A1 | 1/2021 | Kim et al. |

FOREIGN PATENT DOCUMENTS

| | | |
|---|---|---|
| JP | 4098049 B2 | 6/2008 |
| JP | 2010-282125 A | 12/2010 |
| JP | 2016-085376 A | 5/2016 |
| KR | 10-2079256 B1 | 2/2020 |

*Primary Examiner* — Sardis F Azongha
(74) *Attorney, Agent, or Firm* — Innovation Counsel LLP

(57) ABSTRACT

Provided is a display device which includes a substrate having a display area and a non-display area, and a plurality of pads disposed in the non-display area. Each of the pads includes a first electrode layer, a second electrode layer, a third electrode layer, a fourth electrode layer, and a fifth electrode layer which are sequentially disposed on the substrate, and the second electrode layer is in contact with the first electrode layer through a contact hole formed in one or more insulating layers.

20 Claims, 24 Drawing Sheets

DISPLAY DEVICE

CROSS-REFERENCE TO RELATED APPLICATION

This application is a continuation application of U.S. patent application Ser. No. 17/670,103 filed on Feb. 11, 2022, which was claims priority to and benefits of Korean Patent Application No. 10-2021-0084787, filed in the Korean Intellectual Property Office on Jun. 29, 2021, the entire contents of which are incorporated herein by reference.

BACKGROUND

1. Technical Field

The present disclosure generally relates to a display device. More particularly, the present disclosure relates to a display device including pads with improved reliability.

2. Description of the Related Art

A display device such as an emissive display device includes a display panel including pixels for displaying an image. The display panel includes one or more pad portions in which pads for input and output of signals are arranged in order to control an operation of the display panel. An integrated circuit chip or a flexible printed circuit film may be bonded to the pad portion.

As resolution of the display device increases, a larger number of pads are required. It is necessary to reduce a size of the pads in order to increase an integration degree of the pads in the pad portion, which is a limited area. In addition, a number of conductive layers used may increase, which may make it more difficult to reduce the size of the pads.

The above information disclosed in this Background section is only for enhancement of understanding of the background, and therefore, it may contain information that does not form the prior art that is already known in this country to a person of ordinary skill in the art.

SUMMARY

Embodiments have been made in an effort to provide a display device including a pad portion capable of dealing with high resolution. In addition, embodiments have been made in an effort to provide a display device including pads with improved reliability.

A display device according to an embodiment includes a substrate including a display area and a non-display area, and a plurality of pads disposed in the non-display area. Each of the pads may include a first electrode layer, a second electrode layer, a third electrode layer, a fourth electrode layer, and a fifth electrode layer which are sequentially disposed on the substrate, and the second electrode layer may be in contact with the first electrode layer by a contact hole penetrating through at least one insulating layers.

The third electrode layer may entirely cover the second electrode layer, and the fourth electrode layer may entirely cover the third electrode layer.

An insulating layer may not be disposed between the second electrode layer and the third electrode layer, and an insulating layer may not be disposed between the third electrode layer and the fourth electrode layer.

The display device may further include a first insulating layer and a second insulating layer which clad an edge of the fourth electrode layer. The fifth electrode layer may be disposed on the first insulating layer and the second insulating layer, and the fifth electrode layer may be in contact with an upper surface of the fourth electrode layer which is not clad by the first insulating layer and the second insulating layer.

An edge of the fifth electrode layer may be aligned with an edge of the fourth electrode layer.

The display device may further include: a semiconductor layer disposed in the display area of the substrate; a first gate insulating layer disposed on the semiconductor layer; a first gate conductive layer disposed on the first gate insulating layer; a second gate insulating layer disposed on the first gate conductive layers; a second gate conductive layer disposed on the second gate insulating layer; a first interlayer insulating layer disposed on the second gate conductive layers; a first data conductive layer disposed on the first interlayer insulating layer; a first planarization layer disposed on the first data conductive layer; a second data conductive layer disposed on the first planarization layer; a second planarization layer disposed on the second data conductive layer; and a third data conductive layer disposed on the second planarization layer. At least one of the first gate conductive layer and the second gate conductive layer may include the first electrode layer, and each of the first data conductive layer, the second data conductive layer, and the third data conductive layer may include the second electrode layer, the third electrode layer, and the fourth electrode layer.

The display device may further include: a third planarization layer disposed on the third data conductive layer; a light emitting diode disposed on the third planarization layer; an encapsulation layer disposed on the light emitting diode; a first insulating layer disposed on the encapsulation layer; a first touch conductive layer disposed on the first insulating layer; a second insulating layer disposed on the first touch conductive layer; and a second touch conductive layer disposed on the second insulating layer. The second touch conductive layer may include the fifth electrode layer.

The pads may include a first pad and a second pad which are adjacent in a first direction. The display device may further include a wire connected to a pad disposed in an array that is different from that of the first pad and the second pad, and disposed between the first pad and the second pad.

At least one of first pad and the second pad may overlap the wire.

The first pad and the second pad may not overlap the wire.

The first electrode layer and the second electrode layer may be discontinuously disposed in a longitudinal direction of the pad.

The first electrode layer and the second electrode layer may be disposed to overlap opposite sides of the pad in the longitudinal direction of the pad, and may not be disposed in a central portion of the pad.

The second electrode layer may be discontinuously disposed in a longitudinal direction of the pad.

The second electrode layer may be disposed at opposite sides of the pad in the longitudinal direction of the pad, and may not be disposed in a central portion of the pad.

The contact hole may be provided in plural at one side of the pad.

The display device may further include a first insulating layer and a second insulating layer which clad an edge of the fourth electrode layer. The first insulating layer and the second insulating layer may not overlap the second electrode layer.

The display device may further include an organic layer which clads an edge of the second electrode layer.

A display device according to an embodiment includes a substrate including a display area and a non-display area; a semiconductor layer disposed in the display area of the substrate; a first gate conductive layer disposed on the semiconductor layer; a second gate conductive layer disposed on the first gate conductive layer; a first data conductive layer disposed on the second gate conductive layer; a second data conductive layer disposed on the first data conductive layer; a third data conductive layer disposed on the second data conductive layer; a first touch conductive layer disposed on the third data conductive layer; a second touch conductive layer disposed on the first touch conductive layer; and a pad disposed in the non-display area. The pad may include a first electrode layer, a second electrode layer, a third electrode layer, and a fourth electrode layer which are sequentially disposed on the substrate, and the first gate conductive layer or the second gate conductive layer may include the first electrode layer, the first data conductive layer may include the second electrode layer, and the second touch conductive layer may include the fourth electrode layer.

The third data conductive layer may include a plurality of layers, and the third electrode layer may include only a lower layer among the layers of the third data conductive layer.

A lower surface of the third electrode layer may be in contact with an upper surface of the second electrode layer, and an upper surface of the third electrode layer may be in contact with a lower surface of the fourth electrode layer.

The display device may further include a first insulating layer and a second insulating layer which clad edges of the second electrode layers and the third electrode layer. The fourth electrode layer may be disposed on the first insulating layer and the second insulating layer, and the fourth electrode layer may be in contact with an upper surface of the third electrode layer which is not clad by the first insulating layer and the second insulating layer.

According to the embodiments, it is possible to provide a display device including a pad portion capable of dealing with high resolution. In addition, according to the embodiments, it is possible to provide a display device including pads with improved reliability. Further, according to the embodiments, there are other advantageous effects that can be recognized throughout the specification.

DETAILED DESCRIPTION OF THE EMBODIMENTS

Figure 1:
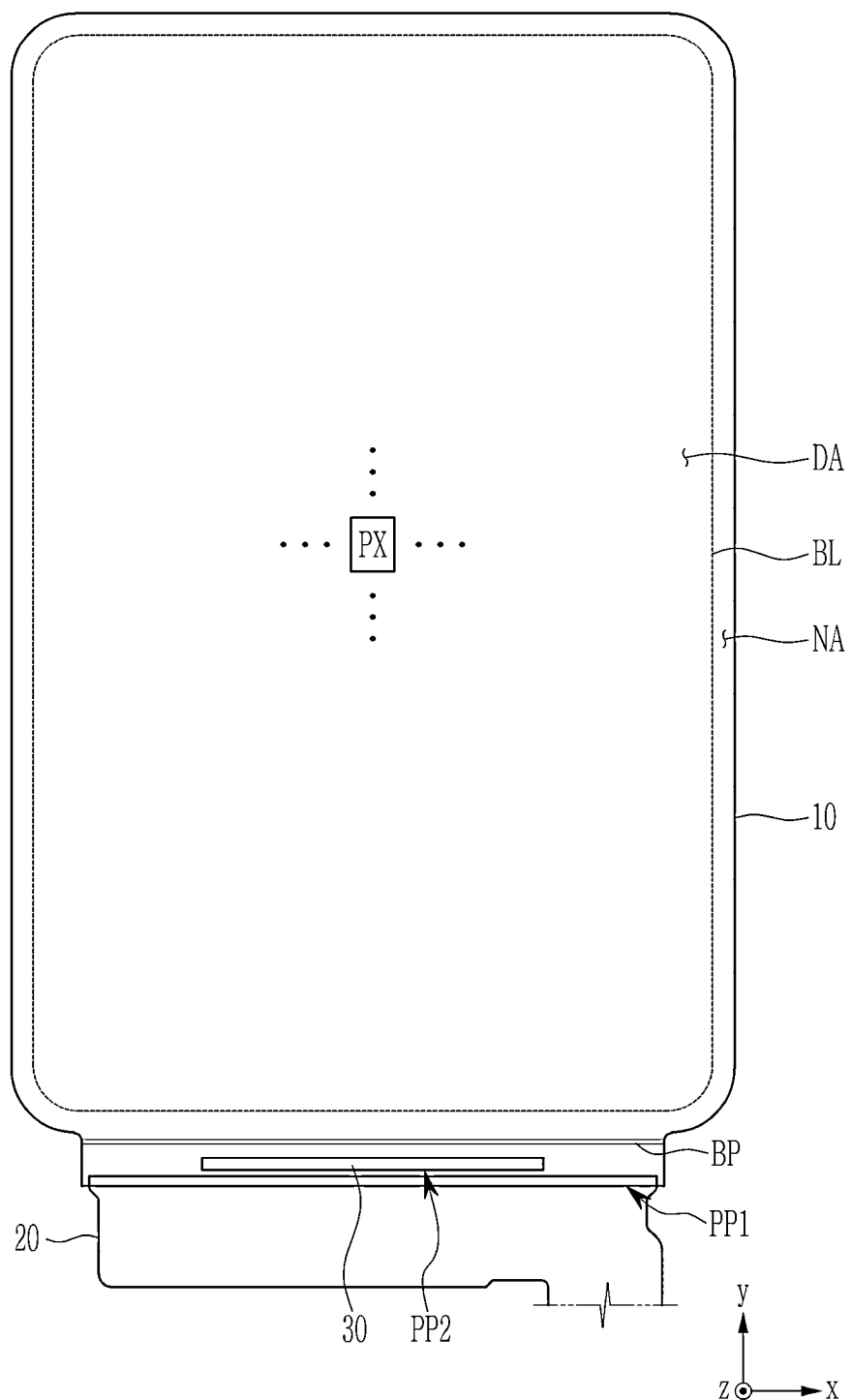
FIG. 1 illustrates a top plan view of a display device according to an embodiment.

The inventive concept will be described more fully hereinafter with reference to the accompanying drawings, in which embodiments are shown.

Further, sizes and thicknesses of constituent elements shown in the accompanying drawings are arbitrarily given for better understanding and ease of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

FIG. 1 illustrates a top plan view of a display device according to an embodiment.

Referring to FIG. 1, the display device includes a display panel 10, a flexible printed circuit film 20 bonded to the display panel 10, and a driving unit including an integrated circuit chip 30, etc.

The display panel 10 includes a display area DA corresponding to a screen on which an image is displayed and a non-display area NA, and circuits and/or signal lines for generating and/or transferring various signals and voltages applied to the display area DA are disposed in the non-display area NA. The non-display area NDA may be positioned to surround a periphery of the display area DA. In FIG. 1, inside and outside of a boundary line BL correspond to the display area DA and the non-display area NA, respectively.

A plurality of pixels PX are disposed in a matrix form in the display area DA of the display panel 10. Signal lines such as a gate line, a data line, a driving voltage line, and an initializing voltage line may be positioned in the display area DA. The gate line may extend approximately in a first direction x, and the data line and the driving voltage line may extend approximately in a second direction y. The initializing voltage line may include a voltage line extending approximately in the first direction x and a voltage line extending approximately in the second direction y, and may be positioned in a mesh shape. Each pixel PX may be connected to the scan line, the data line, the driving voltage line, the initializing voltage line, and the like to receive a gate signal, a data voltage, a driving voltage, and an initializing voltage from these signal lines. Each pixel PX may also receive a common voltage. The pixel PX may be implemented as a light emitting element such as a light emitting diode.

A touch sensor for detecting a user's touch and/or a non-contact touch may be disposed in the display area DA.

At least one pad portion including a first pad portion PP1 and a second pad portion PP2 in which pads for input and output of signals are arranged may be positioned in the non-display area NA of the display panel 10. The first pad portion PP1 may be disposed to extend in a first direction x along one edge of the display panel 10. The flexible printed circuit film 20 is bonded to the first pad portion PP1, and pads of the flexible printed circuit film 20 may be electrically connected to pads of the first pad portion PP1. The second pad portion PP2 may be positioned between the display area DA and the first pad portion PP1. The integrated circuit chip 30 may be bonded to the second pad portion PP2, and bumps of the integrated circuit chip 30 may be electrically connected to the pads of the second pad portion PP2. An anisotropic conductive layer may be positioned between the first pad portion PP1 and the flexible printed circuit film 20 and between the second pad portion PP2 and the integrated circuit chip 30.

A driving unit may be disposed in the non-display area NA of the display panel 10 to generate and/or process various signals for driving the display panel 10. The driving unit may include a data driver for applying a data voltage to the data line, a gate driver for applying a gate signal to the gate line, and a signal controller for controlling the data driver and the gate driver. The pixels PX may receive the data voltage at predetermined timing depending on the gate signal generated by the gate driver. The gate driver may be integrated in the display panel 10, and may be disposed on at least one side of the display area DA. The data driver and the signal controller may be provided as the integrated circuit chip 30. The integrated circuit chip 30 may be bonded to the second pad portion PP2, or may be bonded to the flexible printed circuit film 20, etc. to be electrically connected to the display panel 10.

The display panel 10 may include a bending portion BP. The bending portion BP may be positioned between the display area DA and the second pad portion PP2 to cross the display panel 10 in the first direction x. The display panel 10 may be bent at the bending portion BP with a predetermined radius of curvature based on a bending axis parallel to the first direction x. When the display panel 10 is a top emission type, the first and second pad portions PP1 and PP2 that are farther from the display area DA than the bending portion BP, and the integrated circuit chip 30 and the flexible printed circuit film 20, may be bent to be positioned on a rear surface of the display area DA. The display panel 10 may be in a bent state in this way in an electronic device to which a display device is applied. The bending portion BP may be positioned in the display area DA, or may be positioned over the display area DA and the non-display area NA.

Figure 2:
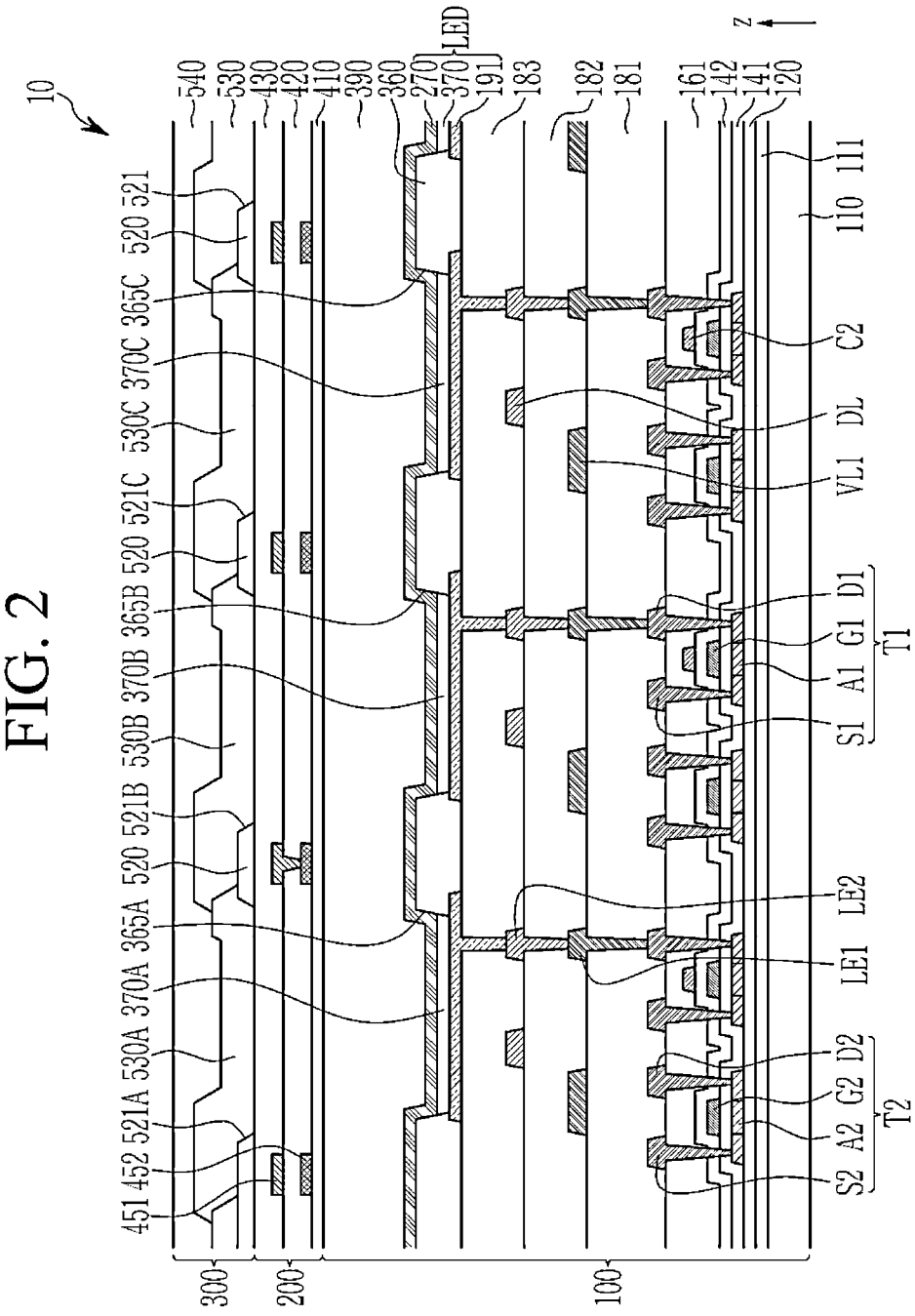
FIG. 2 illustrates a cross-sectional view of a display panel according to an embodiment.

FIG. 2 illustrates a cross-sectional view of a display panel according to an embodiment.

A portion illustrated in FIG. 2 may correspond to approximately three pixel areas in the display area DA.

Referring to FIG. 2, the display panel 10 according to the present embodiment may include a display unit 100, a touch unit 200, and an anti-reflection unit 300.

The display unit 100 may basically include a substrate 110, first and second transistors T1 and T2 formed on the substrate 110, and a light emitting diode LED connected to the first transistor. The light emitting diode LED may correspond to the pixel PX.

The substrate 110 may be a flexible substrate including a polymer layer made of, e.g., a polyimide, a polyamide, and polyethylene terephthalate. The substrate 110 may be a flexible substrate.

A barrier layer 111 that prevents moisture and oxygen from penetrating the substrate 110 may be disposed on the substrate 110. The buffer layer 111 may include an inorganic insulating material such as a silicon nitride ($SiN_x$), a silicon oxide ($SiO_x$), and a silicon oxynitride ($SiO_xN_y$), and may be a single layer or multiple layers.

A buffer layer 120 may be disposed on the barrier layer 111. The buffer layer 120 may improve the characteristics of the semiconductor layer by blocking impurities from the substrate 110 when the semiconductor layer is formed, and may flatten a surface of the substrate 110 to relieve a stress of the semiconductor layer. The buffer layer 120 may include an inorganic insulating material such as a silicon oxide, a silicon nitride, and a silicon oxynitride. The buffer layer 120 may include amorphous silicon.

Semiconductor layers A1 and A2 may be disposed on the buffer layer 120. The semiconductor layers A1 and A2 may each include a first region and a second region, and a channel region therebetween. Each of the semiconductor layers A1 and A2 may include polycrystalline silicon.

A first gate insulating layer 141 may be disposed on the semiconductor layers A1 and A2. The first gate insulating layer 141 may include an inorganic insulating material such as a silicon nitride ($SiN_x$), a silicon oxide ($SiO_x$), and a silicon oxynitride ($SiO_xN_y$), and may be a single layer or multiple layers.

A first gate conductive layer including gate electrodes G1 and G2 may be disposed on the first gate insulating layer 141. The elements included in the first gate conductive layer may be formed by using a same material in a same process. The first gate conductive layer may include molybdenum (Mo), aluminum (Al), copper (Cu), titanium (Ti), and the like, and may be a single layer or multiple layers.

A second gate insulating layer 142 may be disposed on the first gate conductive layer. The second gate insulating layer 142 may include an inorganic insulating material such as a silicon nitride, a silicon oxide, and a silicon oxynitride, and may be a single layer or multiple layers.

A second gate conductive layer including an upper electrode C2 of the storage capacitor, etc. may be disposed on the second gate insulating layer 142. The upper electrode C2 may overlap the gate electrode G1, and the upper electrode C2, the gate electrode G1, and the second gate insulating layer 142 disposed therebetween may constitute a storage capacitor. The elements included in the second gate conductive layer may be formed by using a same material in a same process. The second gate conductive layer may include molybdenum (Mo), aluminum (Al), copper (Cu), titanium (Ti), and the like, and may be a single layer or multiple layers.

A first interlayer insulating layer 161 may be disposed on the gate conductive layer. The first interlayer insulating layer 161 may include an inorganic insulating material such as a silicon nitride, a silicon oxide, and a silicon oxynitride, and may be a single layer or multiple layers. When the first interlayer insulating layer 161 includes the multiple layers, a lower layer thereof may include a silicon nitride and an upper layer thereof may include a silicon oxide.

A first data conductive layer including the first electrodes S1 and S2, the second electrodes D1 and D2, etc. may be disposed on the first interlayer insulating layer 161. Each of the first electrode S1 and the second electrode D1 may be connected to a first region and a second region of the semiconductor layer A1 by contact holes penetrating through the insulating layers 141, 142, and 161. One of the first electrode S1 and the second electrode D1 may serve as a source electrode, and the other may serve as a drain electrode. Each of the first electrode S2 and the second electrode D2 may be connected to a first region and a second region of the semiconductor layer A2 by contact holes penetrating through the insulating layers 141, 142, and 161. One of the first electrode S2 and the second electrode D2 may serve as a source electrode, and the other may serve as a drain electrode. The elements included in first data conductive layer may be formed by using a same material in a same process. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the first data conductive layer may include a lower layer including a refractory metal such as molybdenum, chromium, tantalum, or titanium, an intermediate layer including a metal having low resistivity such as aluminum, copper, or silver, and an upper layer including a refractory metal. For example, the first data conductive layer may have a triple layer structure such as titanium/aluminum/titanium (Ti/Al/Ti).

The semiconductor layer A1, the gate electrode G1, the first electrode S1, and the second electrode D1 may constitute the first transistor T1. The first transistor T1 may be a driving transistor or a transistor connected to one electrode of the driving transistor. The semiconductor layer A2, the gate electrode G2, the first electrode S2, and the second electrode D2 may constitute the second transistor T2. The second transistor T2 may be a transistor connected to the gate electrode G1.

A first planarization layer 181 may be disposed on the first data conductive layer. The first planarization layer 181 may be an organic insulating layer. For example, the first planarization layer 181 may contain poly(methylmethacrylate), a general purpose polymer such as polystyrene, a polymer derivative having a phenolic group, an acrylic polymer, an imide-based polymer (e.g., polyimide), and an organic insulating material such as a siloxane-based polymer.

A second data conductive layer including a driving voltage line VL1 and a first connection electrode LE1 may be disposed on the first planarization layer 181. The first connection electrode LE1 may be connected to the second electrode D1 of the first transistor Ti by a contact hole penetrating through the first planarization layer 181. The elements included in the second data conductive layer may be formed by using a same material in a same process. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the second data conductive layer may have a triple layer structure such as titanium/aluminum/titanium (Ti/Al/Ti).

A second planarization layer 182 may be disposed on the second data conductive layer. The second planarization layer 182 may be an organic insulating layer. For example, the second planarization layer 182 may contain poly(methylmethacrylate), a general purpose polymer such as polystyrene, a polymer derivative having a phenolic group, an acrylic polymer, an imide-based polymer (e.g., polyimide), and an organic insulating material such as a siloxane-based polymer.

A third data conductive layer including the data line DL and the second connection electrode LE2 may be positioned on the second planarization layer 182. The second connection electrode LE2 may be connected to the first connection electrode LE1 by a contact hole penetrating through the second planarization layer 182. The elements included in the third data conductive layer may be formed by using a same material in a same process. The third data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the third data conductive layer may have a triple layer structure such as titanium/aluminum/titanium (Ti/Al/Ti).

Although it has been described that the second data conductive layer may include the driving voltage line VL1 and the third data conductive layer may include the data line DL, signal lines that may be included in each data conductive layer may be variously changed. For example, the second data conductive layer may include the driving voltage line VL1 and the data line DL.

A third planarization layer 183 may be disposed on the third data conductive layer. The third planarization layer 183 may be an organic insulating layer. For example, the third planarization layer 183 may contain poly(methylmethacrylate), a general purpose polymer such as polystyrene, a polymer derivative having a phenolic group, an acrylic polymer, an imide-based polymer (e.g., polyimide), and an organic insulating material such as a siloxane-based polymer.

A pixel conductive layer including a pixel electrode 191 may be disposed on the third planarization layer 183. The pixel electrode 191 may be connected to the second connection electrode LE2 by a contact hole penetrating through the second planarization layer 182. The pixel electrode 191 may be electrically connected to the second electrode D1 to receive a driving current for controlling luminance of the light emitting diode LED. The elements included in pixel conductive layer may be formed by using a same material in a same process. The pixel conductive layer may include a metal such as silver (Ag), lithium (Li), calcium (Ca), aluminum (Al), magnesium (Mg), or gold (Au). The pixel conductive layer may include a transparent conductive oxide (TCO) such as an indium tin oxide (ITO) or an indium zinc oxide (IZO).

A pixel definition layer 360 may be disposed on the pixel conductive layer. A plurality of pixel openings 365A, 365B, and 365C overlapping the pixel electrode 191 may be defined in the pixel definition layer 360. The pixel definition layer 360 may include an organic insulating material, e.g., a general purpose polymer such as poly(methylmethacrylate) or polystyrene, a polymer derivative having a phenolic group, an acrylic polymer, an imide-based polymer (e.g., polyimide), and a siloxane-based polymer. The pixel definition layer 360 may be a black pixel definition layer 360 including a black dye or pigment. The black pixel definition layer 360 may improve a contrast ratio, and may prevent reflection by a metal layer disposed therebelow.

Emission layers 370A, 370B, and 370C may be disposed on the pixel electrode 191. At least a portion of the emission layers 370A, 370B, and 370C may be positioned in the pixel openings 365A, 365B, and 365C. Each of the emission layers 370A, 370B, and 370C may include a material layer that uniquely emits light of primary colors such as red, green, and blue. Each of the emission layers 370A, 370B, and 370C may have a structure in which material layers emitting light of different colors are stacked. In addition to the emission layers 370A, 370B, and 370C, at least one of a hole injection layer, a hole transport layer, an electron transport layer, or an electron injection layer may be disposed on the pixel electrode 191.

A common electrode 270 may be positioned on the emission layers 370A, 370B, and 370C and the pixel definition layer 360. The common electrode 270 may be provided in common to all pixels PX. The common electrode 270 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Jr), chromium (Cr), or lithium (Li). The common electrode 270 may include a transparent conductive oxide (TCO) such as an indium tin oxide (ITO) or an indium zinc oxide (IZO).

The pixel electrode 191, the emission layers 370A, 370B, and 370C, and the common electrode 270 constitute a light emitting diode LED. The pixel electrode 191 may be an anode of the light emitting diode LED, and the common electrode 270 may be a cathode of the light emitting diode LED.

An encapsulation layer 390 may be disposed on the common electrode 270. The encapsulation layer 390 may prevent penetration of moisture and oxygen from the outside by encapsulating the light emitting diode LED. The encapsulation layer 390 may be a thin film encapsulation layer including one or more inorganic layers and one or more organic layers. For example, the encapsulation layer 390 may have a triple-layered structure of inorganic layer/organic layer/inorganic layer.

A touch unit 200 may be positioned on the encapsulation layer 390.

The touch unit 200 may include a first insulating layer 410 disposed on the encapsulation layer 390. The first insulating layer 410 may cover the encapsulation layer 390 to protect the encapsulation layer 390 and to prevent moisture permeation. The first insulating layer 410 may reduce parasitic capacitance between the common electrode 270 and a touch electrode 451.

A first touch conductive layer including a bridge 452 may be disposed on the first insulating layer 410, and a second insulating layer 420 may be disposed on the first touch conductive layer. A second touch conductive layer including the touch electrode 451 may be disposed on the second insulating layer 420, and a passivation layer 430 may be disposed on the second touch conductive layer.

The touch electrode 451 may include first and second touch electrodes constituting a mutual sensing capacitor. The bridge 452 may electrically connect the first touch electrodes or the second touch electrodes. For example, first touch electrodes that are adjacently separated from each other may be connected to the bridge 452 through contact holes formed in the second insulating layer 420, and may be electrically connected through the bridge 452.

The first insulating layer 410 and the first interlayer insulating layer 420 may each include an inorganic insulating material such as a silicon nitride, a silicon oxide, and a silicon oxynitride, and may be a single layer or multiple layers. The passivation layer 430 may include an inorganic insulating material such as a silicon nitride, a silicon oxide, or a silicon oxynitride, or an organic material such as an acrylic polymer or a polyimide-based resin.

The first touch electrode layer and the second touch electrode layer may each have a mesh shape having openings overlapping the pixels PX. The elements included in the first touch electrode layer may be formed by using a same material in a same process. The elements included in second touch electrode layer may be formed by using a same material in a same process. The first touch electrode layer and the second touch electrode layer may each include a metal such as aluminum (Al), cooper (Cu), titanium (Ti), molybdenum (Mo), silver (Ag), chromium (Cr), or nickel (Ni).

The anti-reflection unit 300 may be positioned on the touch unit 200.

The anti-reflection unit 300 may include a light blocking layer 520 and color filters 530A, 530B, and 530C.

The light blocking layer 520 may overlap the pixel definition layer 360 of the display unit 100, and may be narrower than the pixel definition layer 360. A plurality of openings 521A, 521B, and 521C overlapping the pixel openings 365A, 365B, and 365C of the pixel definition layer 360 may be defined in the light blocking layer 520.

The color filters 530A, 530B, and 530C may be positioned on the light blocking layer 520. Most of the color filters 530A, 530B, and 530C may overlap the openings 521A, 521B, and 521C of the light blocking layer 520. An overcoat layer 540 may be disposed on the color filters 530A, 530B, and 530C.

The anti-reflection unit 300 may prevent external light incident from the outside from being visually recognized by being reflected by a wire or the like. The light blocking layer 520 and the color filters 530A, 530B, and 530C may be combined to function as an anti-reflection layer. In such a structure, a polarization layer may not be required as an anti-reflection layer, and thus light output efficiency may be increased, and a thickness of the display panel 10 may be reduced.

Figure 3:
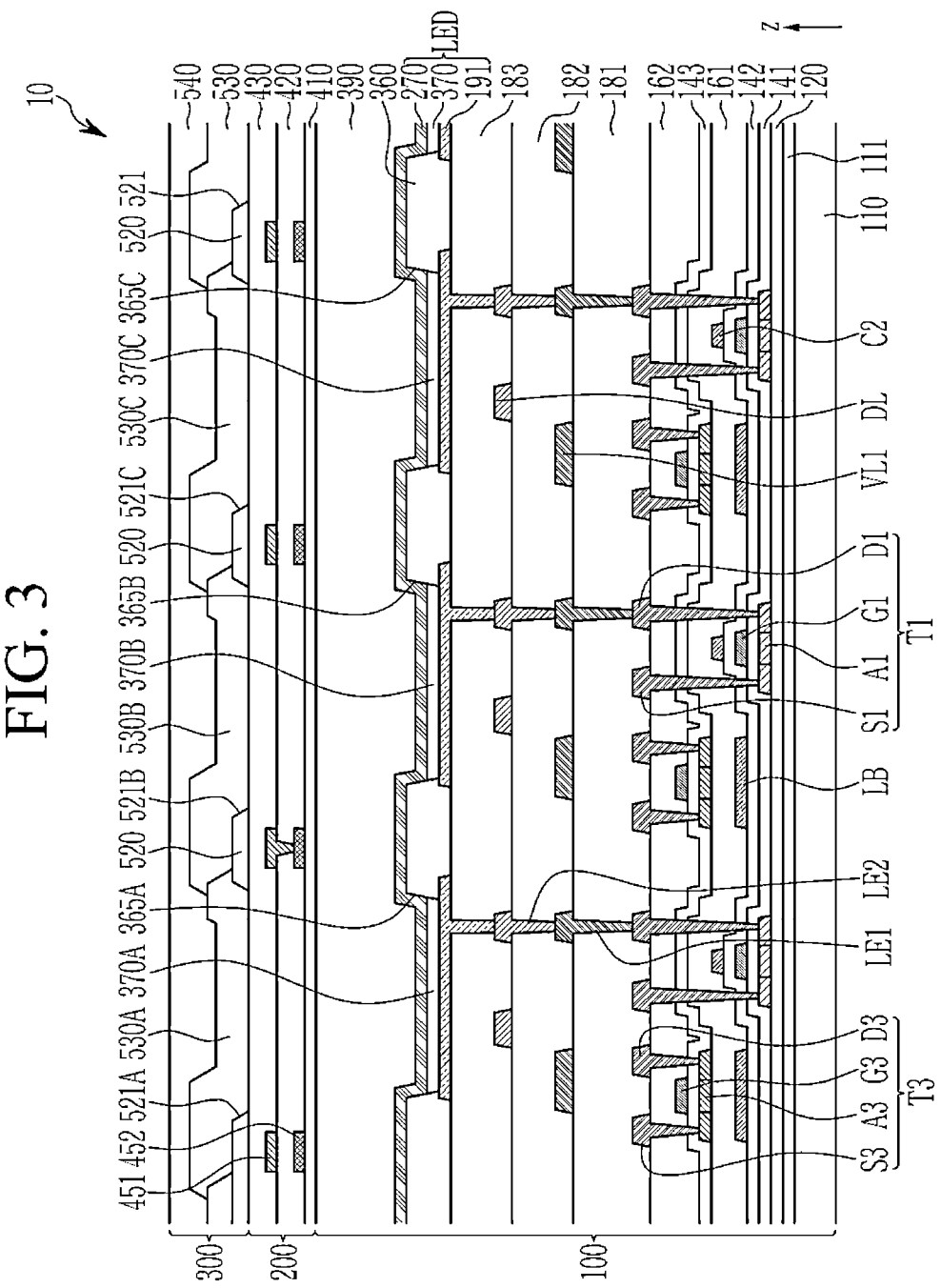
FIG. 3 illustrates a cross-sectional view of a display panel according to an embodiment.

FIG. 3 illustrates a cross-sectional view of a display panel according to an embodiment.

The display panel 10 illustrated in FIG. 3 includes a third transistor T3 having a structure that is different from that of the transistors T1 and T2 of the display panel 10 illustrated in FIG. 2, and has a stacked structure for implementing the third transistor T3.

When a difference from the display panel of FIG. 2 is mainly described, a first gate conductive layer including the gate electrode G1, etc. may be disposed on the first gate insulating layer 141 of the display panel 10.

A second gate insulating layer 142 may be disposed on the first gate conductive layer.

A second gate conductive layer, which may include a light blocking layer LB, an upper electrode C2 of a storage capacitor, and the like, may be disposed on the second gate insulating layer 142. The upper electrode C2 may overlap the gate electrode G1, and the upper electrode C2, the gate electrode G1, and the second gate insulating layer 142 disposed therebetween may constitute a storage capacitor. The light blocking layer LB may block external light from reaching the semiconductor layer A3, thereby preventing deterioration of a characteristic of the semiconductor layer A2.

A first interlayer insulating layer 161 may be disposed on the gate conductive layer. The first interlayer insulating layer 161 may include an inorganic insulating material such as a silicon nitride, a silicon oxide, and a silicon oxynitride, and may be a single layer or multiple layers. When the first interlayer insulating layer 161 includes the multiple layers, a lower layer thereof may include a silicon nitride and an upper layer thereof may include a silicon oxide.

The semiconductor layer A3 may be disposed on the first interlayer insulating layer 161. The semiconductor layer A3 may overlap the light blocking layer LB. The semiconductor layer A3 may include a first region, a second region, and a channel region disposed therebetween. The semiconductor layer A3 may include an oxide semiconductor. The semiconductor layer A3 may include at least one of zinc (Zn), indium (In), gallium (Ga), or tin (Sn). For example, the semiconductor layer A3 may include an indium-gallium-zinc oxide (IGZO).

A third gate insulating layer 143 may be disposed on the semiconductor layer A3. The third gate insulating layer 143 may include an inorganic insulating material such as a silicon nitride, a silicon oxide, and a silicon oxynitride, and may be a single layer or multiple layers.

A third gate conductive layer, which may a gate electrode G3, etc. may be disposed on the third gate insulating layer 143. The elements included in the third gate conductive layer may be formed by using a same material in a same process. The third gate conductive layer may include molybdenum (Mo), aluminum (Al), copper (Cu), titanium (Ti), and the like, and may be a single layer or multiple layers. For example, the third gate conductive layer may include a lower layer including titanium and an upper layer including molybdenum, and the lower layer may prevent diffusion of fluorine (F) as an etching gas during dry etching of the upper layer.

A second interlayer insulating layer 162 may be disposed on the third gate conductive layer. The second interlayer insulating layer 162 may include an inorganic insulating material such as a silicon nitride, a silicon oxide, and a silicon oxynitride, and may be a single layer or multiple layers. The second interlayer insulating layer 162 may include, e.g., a lower layer including a silicon nitride and an upper layer including a silicon oxide.

A first data conductive layer including the first electrodes S1 and S3, the second electrodes D1 and D3 may be disposed on the second interlayer insulating layer 162. Each of the first electrode S1 and the second electrode D1 may be connected to a first region and a second region of the semiconductor layer A1 by contact holes penetrating through the insulating layers 141, 142, 161, 143, and 162. Each of the first electrode S3 and the second electrode D3 may be connected to a first region and a second region of the semiconductor layer A3 by contact holes penetrating through the insulating layers 143 and 162.

The semiconductor layer A1, the gate electrode G1, the first electrode S1, and the second electrode D1 may constitute the first transistor T1. The semiconductor layer A3, the gate electrode G3, the first electrode S3, and the second electrode D3 may constitute the third transistor T3. The light blocking layer LB may be electrically connected to the gate electrode G3 to function as a lower gate electrode of the third transistor T3. The third transistor T3 may be a transistor to be connected to the gate electrode G1.

As described above, the semiconductor layer A1 may include a polycrystalline semiconductor, and the semiconductor layer A3 may include an oxide semiconductor. Power consumption may increase when the display panel 10 is driven at a high speed (e.g., at a frequency of about 120 Hz) in order to increase display quality (particularly, display quality of a moving image). Accordingly, a still image may be driven at a low speed (e.g., about 1 Hz to about 10 Hz) in order to simultaneously improve display quality and power consumption. The semiconductor layer A3 of the third transistor T3, which may have a problem of a leakage current during low-speed driving, may include an oxide semiconductor, thereby reducing the leakage current. The first transistor T1 having no problem with the leakage current even when driving at a low speed may have high electron mobility because the semiconductor layer A1 includes a polycrystalline semiconductor. That is, the first transistor T1 and the third transistor T3 of one pixel PX may include different semiconductor materials, thereby improving display quality, power consumption, and reliability.

Figure 4:
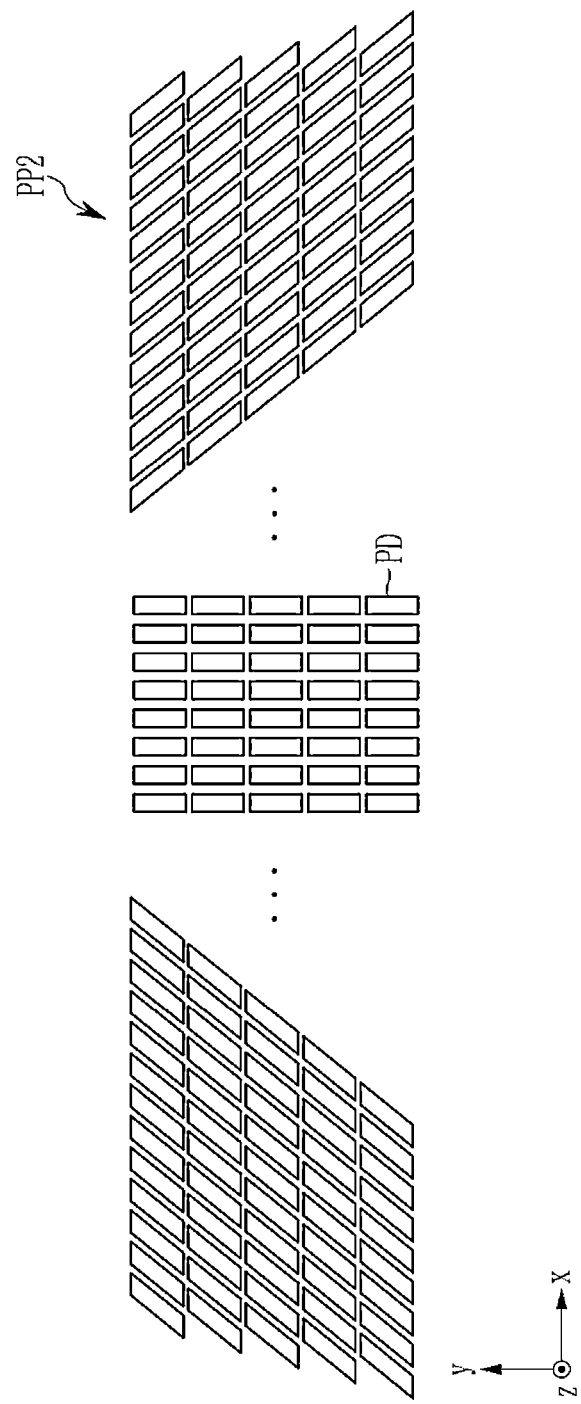
FIG. 4 illustrates a disposal of pads in a pad portion according to an embodiment.

FIG. 4 illustrates a disposal of pads in a pad portion according to an embodiment.

Pads illustrated in FIG. 4 may be pads to which output terminals of the integrated circuit chip 30 are connected in the pad portion PP2.

The pads PD are arranged in the pad portion PP2 to which the integrated circuit chip 30 is bonded. The pads PD may include pads for transmitting signals (e.g., image data and related signals, power, etc.) to the integrated circuit chip 30 and pads for receiving signals outputted from the integrated circuit chip 30 (e.g., a data voltage, a gate driver control signal, etc.). The illustrated pads PD may be pads for receiving signals outputted from the integrated circuit chip 30, i.e., pads connected to the output terminals of the integrated circuit chip 30. Most of the pads PD may be electrically connected to data lines positioned in the display area DA, and may receive a data voltage applied to the pixels PX through the data lines from the integrated circuit chip 30. Wires connected to the pads PD may be positioned between the pad portion PP2 and the display area DA to electrically connect signal lines such as data lines and the pads PD.

Since a plurality of pads maybe positioned on the pad portion PP2 depending on high resolution of the display device, the pads PD may be arranged in a plurality of arrays. In each row, the pads PD may be positioned at a predetermined interval along the first direction x. Each of the pads PD may have an overall quadrangular planar shape. That is, the pad PD may have a long side (length) along the second direction y and a short side (width) along the first direction x. Long sides of the pads PD positioned in the left region and aright region of the pad portion PP2 may be inclined with respect to the first direction x and the second direction y. For example, in the pad portion PP2, the pads PD positioned in a central region may have a quadrangular planar shape, and the pads PD positioned in the left region and the right region may have a parallelogram planar shape.

Figure 5:
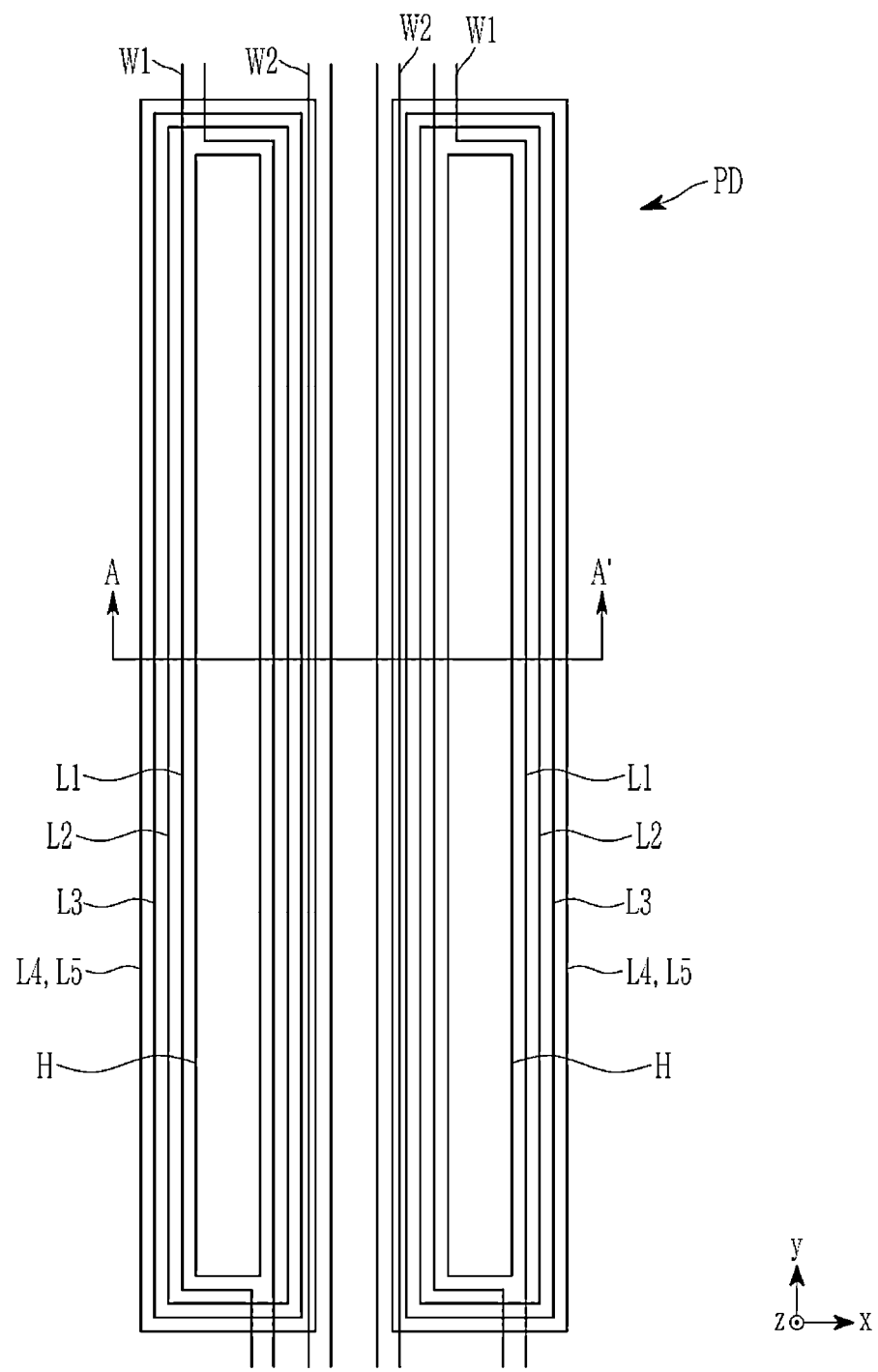
FIG. 5 illustrates a top plan view of a pad according to an embodiment.
Figure 6:
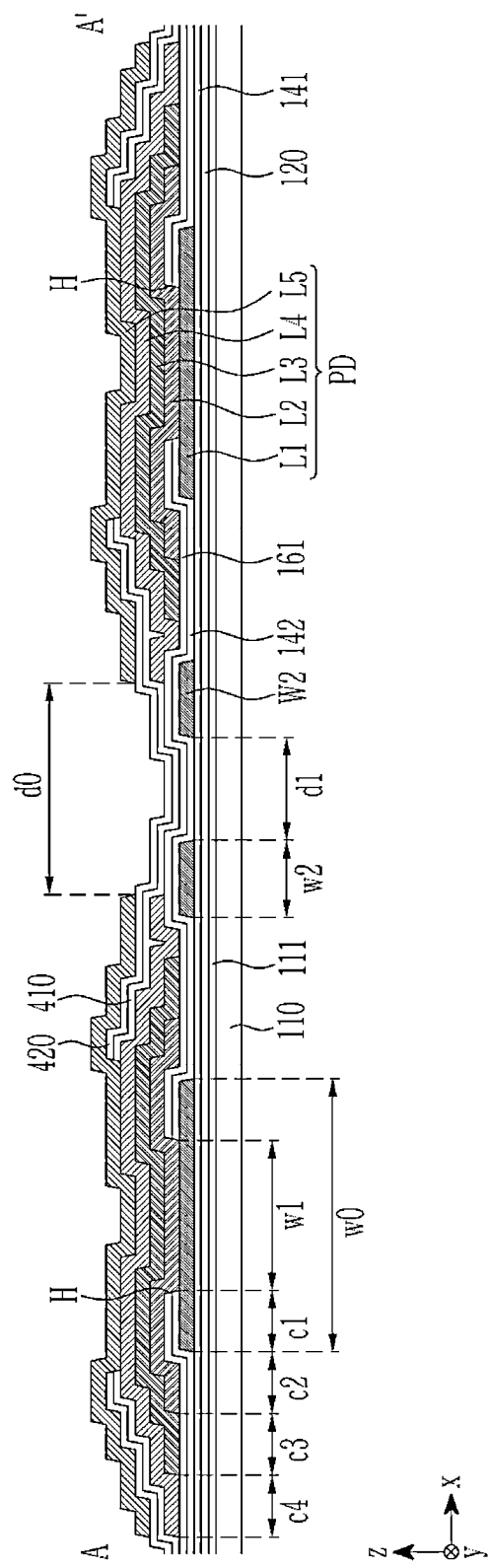
FIGS. 6, 7, 8, and 9 illustrate a cross-sectional view taken along line A-A' of FIG. 5 according to an embodiment.
Figure 7:
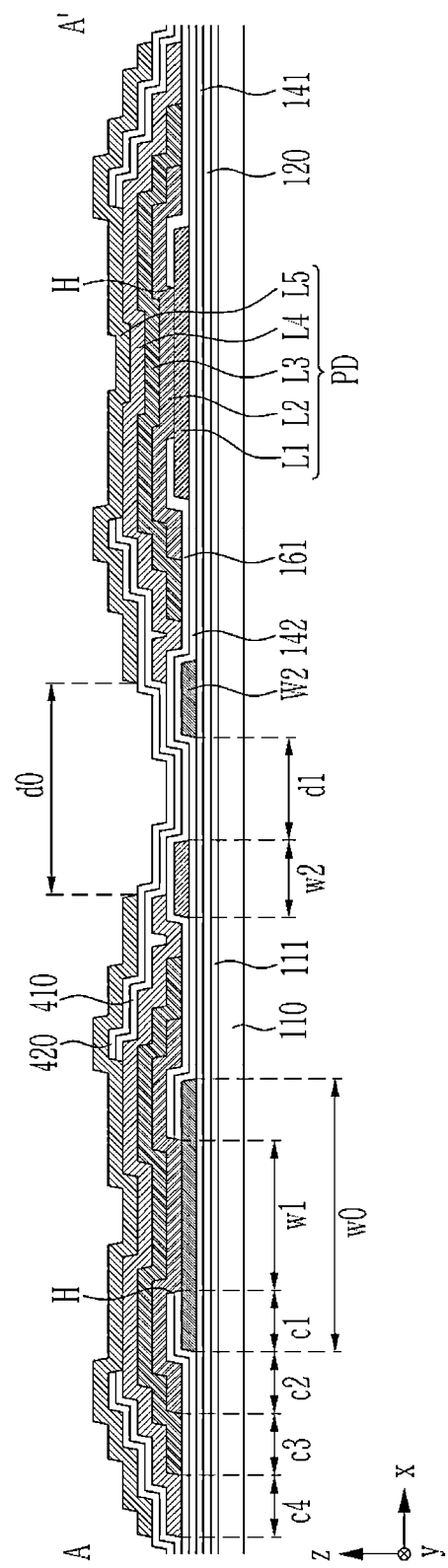
Figure 8:
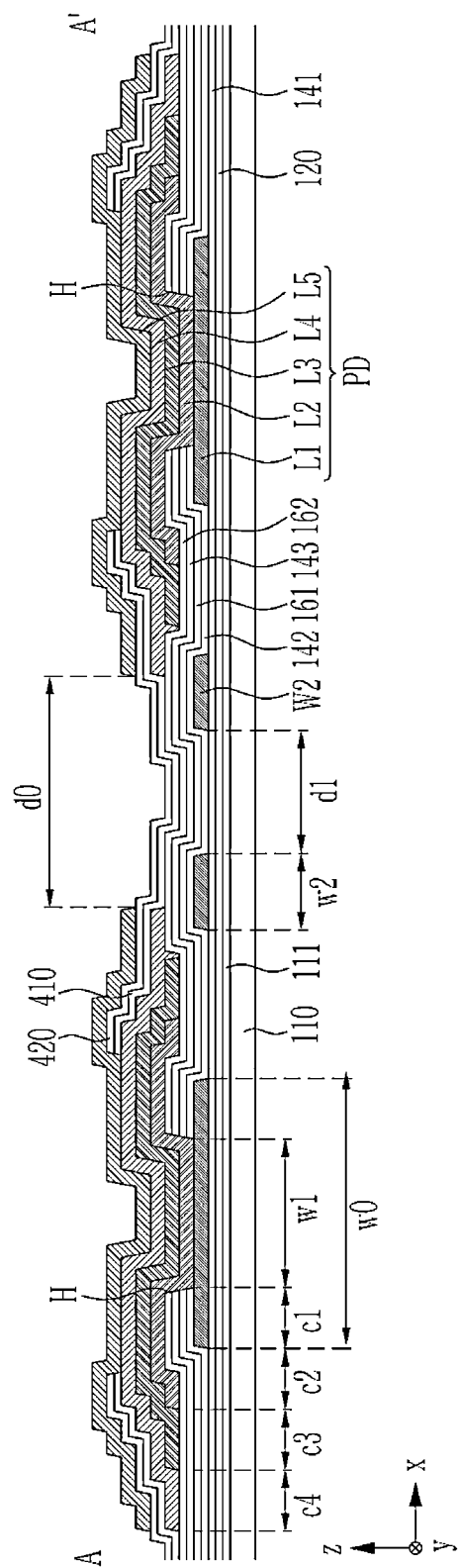

FIG. 5 illustrates a top plan view of a pad according to an embodiment, and FIGS. 6, 7, 8, and, illustrate a cross-sectional view taken along line A-A' of FIG. 5 according to an embodiment.

FIGS. 5, 6, 7, 8, and 9 illustrate two adjacent pads PD positioned in the pad portion PP2. FIG. 5 illustrates edges of each electrode layer L1, L2, L3, L4, and L5 of the pad PD, a contact hole H, and wires W1 and W2. The pads PD illustrated in FIG. 6 and FIG. 7 may be included in the display panel 10 illustrated in FIG. 2, and the pads PD illustrated in FIG. 8 and FIG. 9 may be included in the display panel 10 illustrated in FIG. 3. The illustrated pads may be two adjacent pads among the pads positioned in the pad portion PP1.

Referring to FIG. 5 and FIG. 6, at least some of insulating layers and conductive layers positioned in the display area DA illustrated in FIG. 2 may be positioned in the pad portion PP2. The pad PD may include conductive layers positioned in the display area DA. Accordingly, in describing the pad PD, a relationship between the insulating layers and the conductive layers positioned in the display area DA will also be described.

The pad PD may include a first electrode layer L1, a second electrode layer L2, a third electrode layer L3, a fourth electrode layer L4, and a fifth electrode layer L5 positioned on the substrate 110. The fifth electrode layer L5 may be an uppermost layer of the pad PD.

A barrier layer 111, a buffer layer 120, and a first gate insulating layer 141 may be positioned between the substrate 110 and the first electrode layer L1. The first electrode layer L1 may be formed by using a same material in a same process as those of the gate electrode G1 of the first transistor T1. That is, the first gate conductive layer may include the gate electrode G1 and the first electrode layer L1. A first end of the first electrode layer L1 may be connected to a signal line such as a data line and a wire W1 for electrical connection of the pad PD. The first electrode layer L1 may be an extension of the wire W1. A wire W2 connected to a pad of another pad array may be positioned between the adjacent pads PD. The first gate conductive layer may further include the wires W1 and W2. A portion of the wire W2 may overlap the pad PD.

A second gate insulating layer 142 and a first interlayer insulating layer 161 may be disposed on the first electrode layer L1. An edge of the first electrode layer L1 may be clad by the second gate insulating layer 142 and the first interlayer insulating layer 161. For example, a width w0 of the first electrode layer L1 may be about 7 µm to about 9 µm, and a cladding width c1 may be about 1.5 µm to about 2 µm. A width of the wire W2 may be about 2.5 µm, and an interval between adjacent wires W2 may be about 3.5 µm. A distance d0 between the adjacent pads PD may be about 5.9 µm to about 8.9 µm.

A second electrode L2 may be positioned on the first interlayer insulating layer 161. The second electrode layer L2 may contact the first electrode layer L1 through a contact hole H formed in the second gate insulating layer 142 and the first interlayer insulating layer 161. For example, the width w1 of the contact hole H may be about 5 µm. The second electrode layer L2 may be formed by using a same material in a same process as those of the first electrodes S1 and S2 and the second electrodes D1 and D2 of the first and second transistors T1 and T2. That is, the first data conductive layer may include the first electrodes S1 and S2, the second electrodes D1 and D2, and the second electrode layer L2.

The second electrode layer L2 may entirely cover the first electrode layer L1. For example, a second interval c2 between an edge of the second electrode layer L2 and an edge of the first electrode layer L1 may be about 1 µm to about 2 µm. The barrier layer 111 which may be an inorganic insulating layer, the buffer layer 120, the first gate insulating layer 141, the second gate insulating layer 142, and the first interlayer insulating layer 161 may be positioned between the edge of the second electrode layer L2 and the substrate 110.

The third electrode layer L3 may be disposed on the second electrode layer L2. The third layer L3 may be formed of a same material in a same process as those of the driving voltage line VL1. That is, the second data conductive layer may include the driving voltage line VL1 and the third electrode layer L3.

A first planarization layer 181 disposed between the first data conductive layer and the second data conductive layer in the display area DA may not be disposed on the pad portion PP2. Accordingly, the first planarization layer 181 may not be disposed between the second electrode layer L2 and the third electrode layer L3, and the third electrode layer L3 may be disposed directly on the second electrode layer L2. The third electrode layer L3 may entirely cover the second electrode layer L2. For example, a third interval c3 between an edge of the third electrode layer L3 and the edge of the second electrode layer L2 may be about 1 µm to about 2 µm. An entire upper surface of the second electrode layer L2 may be in contact with a lower surface of the third electrode layer L3.

The fourth electrode layer L4 may be disposed on the third electrode layer L3. The fourth electrode layer L4 may be formed of a same material in a same process as those of the data line DL. That is, the third data conductive layer may include the data line DL and the fourth electrode layer L4.

A second planarization layer 182 disposed between the second data conductive layer and the third data conductive layer in the display area DA may not be disposed on the pad portion PP2. Accordingly, the second planarization layer 182 may not be disposed between the third electrode layer L3 and the fourth electrode layer L4, and the fourth electrode layer L4 may be positioned directly on the third electrode layer L3. The fourth electrode layer L4 may entirely cover the third electrode layer L3. For example, a fourth interval c4 between an edge of the fourth electrode layer L4 and the edge of the third electrode layer L3 may be about 1 µm to about 2 µm. An entire upper surface of the third electrode layer L3 may be in contact with a lower surface of the fourth electrode layer L4.

The first insulating layer 410 and the second insulating layer 420 may be disposed on the fourth electrode layer L4. The edge of the fourth electrode layer L4 may be clad by the first insulating layer 410 and the second insulating layer 420. A cladding width may be greater than a gap (c3+c4) between the edge of the fourth electrode layer L4 and the edge of the second electrode layer L2.

The fifth electrode layer L5 may be disposed on the second insulating layer 420. The fifth electrode layer L5 may be an uppermost layer of the pad PD. The fifth electrode layer L5 may contact a bump of the integrated circuit chip 30 or conductive particles of the anisotropic conductive layer. The fifth electrode layer L5 may be formed of a same material in a same process as those of the touch electrode 451 of the touch unit 200 of the display area DA. That is, the second touch conductive layer may include the touch electrode 451 and the fifth electrode layer L5. The fifth electrode layer L5 may contact an upper surface of the fourth electrode layer L4 that is not covered by the first insulating layer 410 and the second insulating layer 420. In other words, the fifth electrode layer L5 may contact the fourth electrode layer L4 through a contact hole formed in the first insulating layer 410 and the second insulating layer 420. A region in which the fifth electrode layer L5 contacts the fourth electrode layer L4 may overlap the contact hole H. The edge of the fifth electrode layer L5 may be aligned with that of the fourth electrode layer L4. For example, the fifth electrode layer L5 may have substantially a same planar shape as that of the fourth electrode layer L4. The fifth electrode layer L5 and the fourth electrode layer L4 may overlap a portion of the wire W2.

The fifth electrode layer L5 of the pad PD is in contact with the fourth electrode layer L4, the fourth electrode layer L4 is in contact with the third electrode layer L3, the third electrode layer L3 is in contact with the second electrode layer L2, and the second electrode layer L2 is in contact with the first electrode layer L1, and thus a signal inputted through the fifth electrode layer L5 may be transferred to the wire W1 through the fourth electrode layer L4, the third electrode layer L3, the second electrode layer L2, and the first electrode layer L1.

The embodiment illustrated in FIG. 7 is different from the embodiment illustrated in FIG. 6 in the wire W2 and the first electrode layer L1 of the pad PD.

Referring to FIG. 7, the first electrode layer L1 of one (right pad) of two adjacent pads PD may be disposed between the second gate insulating layer 142 and the first interlayer insulating layer 161. One (left pad) of the two adjacent pads PD may be disposed between the second gate insulating layer 142 and the first interlayer insulating layer 161. The first electrode layer L1 and the wire W2 positioned between the second gate insulating layer 142 and the first interlayer insulating layer 161, and the wire W1 connected to the first electrode layer L1 (refer to FIG. 5) may be formed of a same material in a same process as those of the upper electrode C2 of the storage capacitor of the display area DA. That is, the second gate conductive layer may include the upper electrode C2, the first electrode layer L1, and the wires W1 and W2. The second electrode layer L2 may contact the first electrode layer L1 through a contact hole H formed in the first interlayer insulating layer 161.

In the illustrated embodiment, in one (left pad) of the adjacent pads PD of the pad portion PP2, the first electrode layer L1 and the wire W1 connected thereto are formed as a first gate conductive layer, and in the other (right pad), the first electrode layer L1 and the wire W1 connected thereto are formed as a second gate conductive layer. In addition, one (right wire) of adjacent wires W2 is formed as the first gate conductive layer, and the other (left wire) includes the first electrode layer L1 formed as the second gate conductive layer. When the first electrode layer L1 and the wires W1 and W2 are formed as the first and second gate conductive layers, the adjacent wires W1 and W2 may be insulated by the second gate insulating layer 142, and thus a width of the wires W1 and W2 may be widened (thus reducing a resistance thereof), or an integration degree thereof may be increased.

The embodiment illustrated in FIG. 8 is different from the embodiment illustrated in FIG. 6 in the insulating layer positioned between the first electrode layer L1 and the second electrode layer L2 of the pad PD.

Referring to FIG. 8, at least some of insulating layers and conductive layers positioned in the display area DA illustrated in FIG. 3 may be positioned in the pad portion PP2. The pad PD may include a first electrode layer L1, a second electrode layer L2, a third electrode layer L3, a fourth electrode layer L4, and a fifth electrode layer L5 positioned on the substrate 110. The fifth electrode layer L5 may be an uppermost layer of the pad PD. The first electrode layer L1 may be a first gate conductive layer, the second electrode layer L2 may be a first data conductive layer, the third electrode layer L3 may be a second data conductive layer, the fourth electrode layer L4 may be a third data conductive layer, and the fifth electrode layer L4 may be a second touch conductive layer. A first end of the first electrode layer L1 may be connected to the wire W1, and the first electrode layer L1 may be an extension of the wire W1. The wire W2 connected to another pad may be positioned between adjacent pads PD, and the wires W1 and W2 may each be a first data conductive layer.

The second gate insulating layer 142, the first interlayer insulating layer 161, the third gate insulating layer 143, and the second interlayer insulating layer 162 may be disposed on the first electrode layer L1. The edge of the first electrode layer L1 may be clad by the second gate insulating layer 142, the first interlayer insulating layer 161, the third gate insulating layer 143, and the second interlayer insulating layer 162.

The second electrode L2 may be positioned on the second interlayer insulating layer 162. The second electrode layer L2 may contact the first electrode layer L1 through a contact hole H formed in the second gate insulating layer 142, the first interlayer insulating layer 161, the third gate insulating layer 143, and the second interlayer insulating layer 162.

Hereinafter, some modified embodiments of the pad portion PP2 will be described. Although the display area DA is described based on the display panel 10 having the cross-sectional structure illustrated in FIG. 2, the embodiments may be applied to the display panel 10 having a cross-sectional structure illustrated in FIG. 3.

Figure 9:
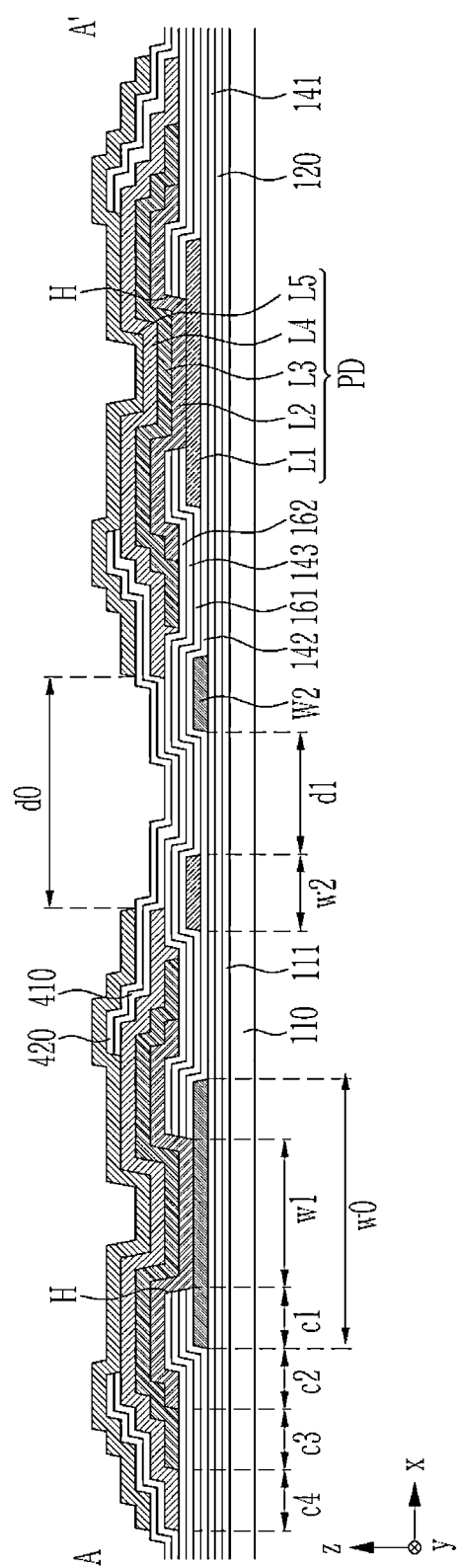

The embodiment illustrated in FIG. 9 is different from the embodiment illustrated in FIG. 8 in the wire W2 and the first electrode layer L1 of the pad PD.

Referring to FIG. 9, the first electrode layer L1 of one (right pad) of two adjacent pads PD may be disposed between the second gate insulating layer 142 and the first interlayer insulating layer 161. One (left pad) of the two adjacent pads PD may be disposed between the second gate insulating layer 142 and the first interlayer insulating layer 161. The first electrode layer L1 and the wire W2 positioned between the second gate insulating layer 142 and the first interlayer insulating layer 161, and the wire W1 connected to the first electrode layer L1 (refer to FIG. 5), may be a second gate conductive layer. The second electrode layer L2 may contact the first electrode layer L1 through a contact hole H formed in the first interlayer insulating layer 161, the third gate insulating layer 143, and the second interlayer insulating layer 162. Similar to the embodiment of FIG. 7, when the first electrode layer L1 and the wires W1 and W2 are formed as the first and second gate conductive layers, the adjacent wires W1 and W2 may be insulated by the second gate insulating layer 142, and thus a width of the wires W1 and W2 may be widened, or an integration degree thereof may be increased.

Figure 10:
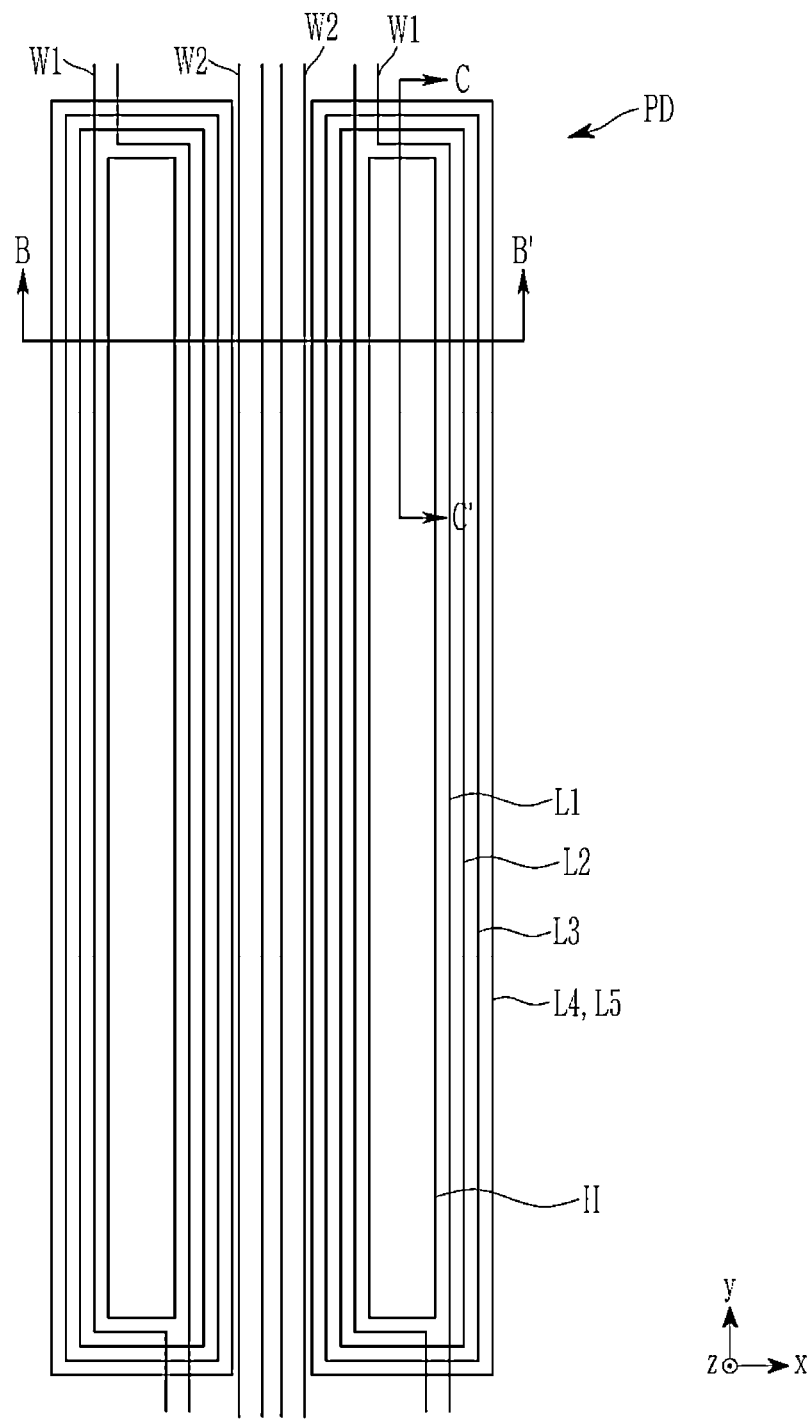
FIG. 10 illustrates a top plan view of a pad according to an embodiment.
Figure 11:
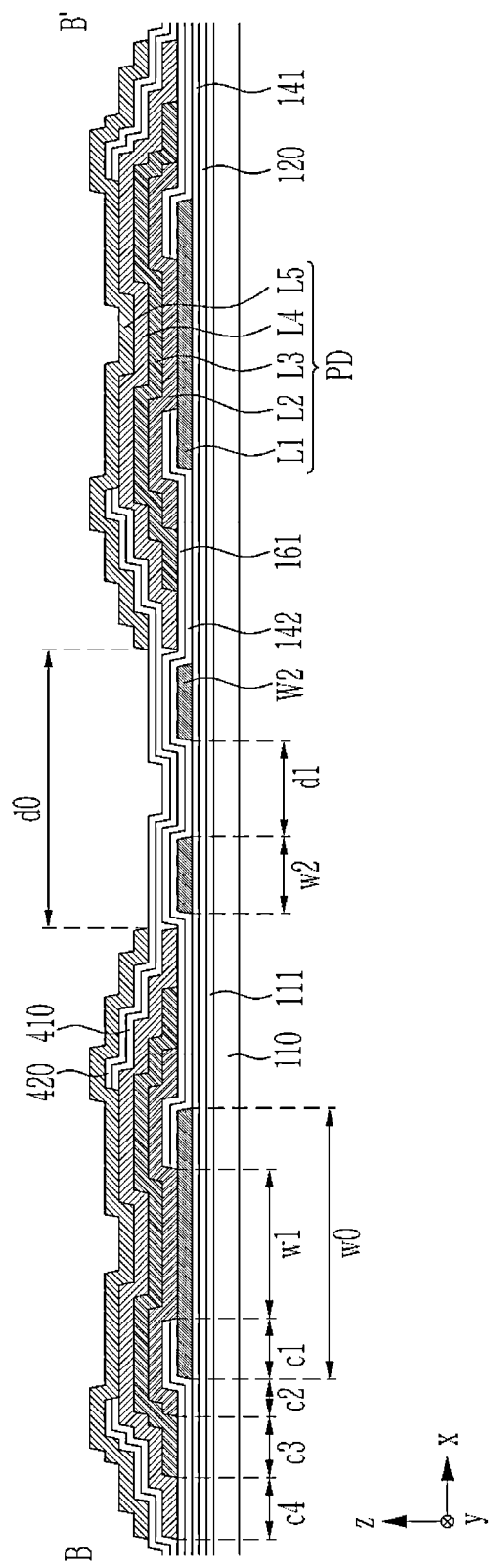
FIG. 11 illustrates a cross-sectional view taken along line B-B' of FIG. 10 according to an embodiment.
Figure 12:
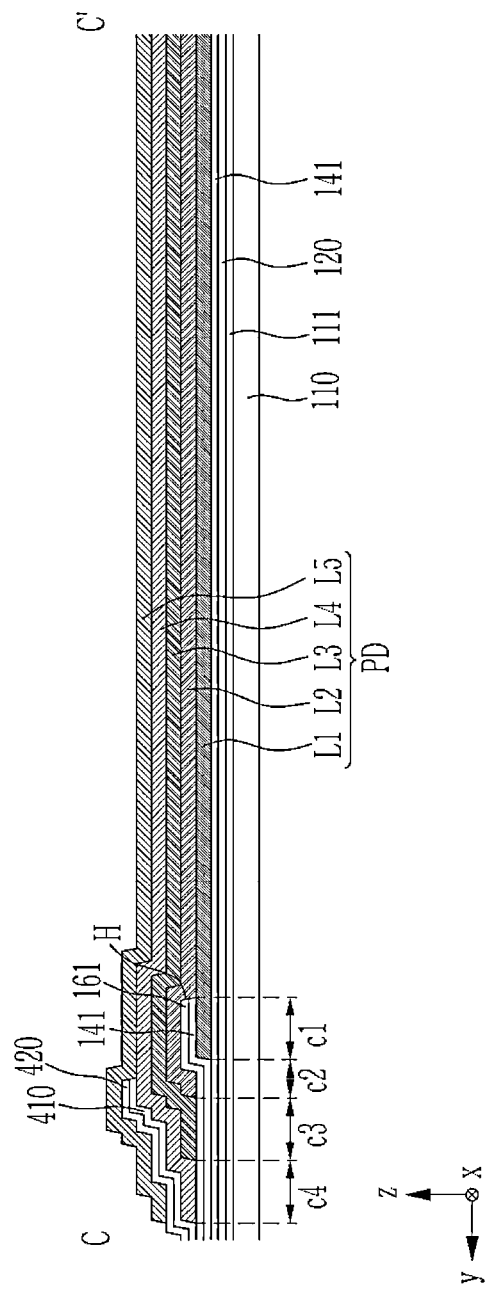
FIG. 12 illustrates a cross-sectional view taken along line C-C' of FIG. 10 according to an embodiment.

FIG. 10 illustrates a top plan view of a pad according to an embodiment, FIG. 11 illustrates a cross-sectional view taken along line B-B' of FIG. 10 according to an embodiment, and FIG. 12 illustrates a cross-sectional view taken along line C-C' of FIG. 10 according to an embodiment.

The embodiment of FIGS. 10, 11, and 12 is different from the embodiment of FIG. 6 in that the wire W2 is positioned so as to not overlap the pad PD. A second interval c2 between an edge of the second electrode layer L2 and an edge of the first electrode layer L1, a third interval c3 between an edge of the third electrode layer L3 and the edge of the second electrode layer L2, and/or a fourth interval c4 between an edge of the fourth electrode layer L4 and the edge of the third electrode layer L3 may be reduced compared to the embodiment of FIG. 6 such that the wire W2 does not overlap the pad PD with little or no change in the pitch of the pad PD. For example, the second interval c2 may be about 1 the third interval c3 may be about 1.5 and the fourth interval c4 may be about 1.5 Accordingly, a width of the pad PD may become narrow, and a distance d0 between the adjacent pads PD may increase. Such a modification to the embodiment of FIG. 6 may be equally applied to the embodiments of FIGS. 7, 8, and 9.

One contact hole H may be elongated in a longitudinal direction of the pad PD in the second gate insulating layer 142 and the first interlayer insulating layer 161 positioned between the first electrode layer L1 and the second electrode layer L. Accordingly, the second electrode layer L2 may contact the first electrode layer L1 in the longitudinal direction of the pad PD.

Figure 13:
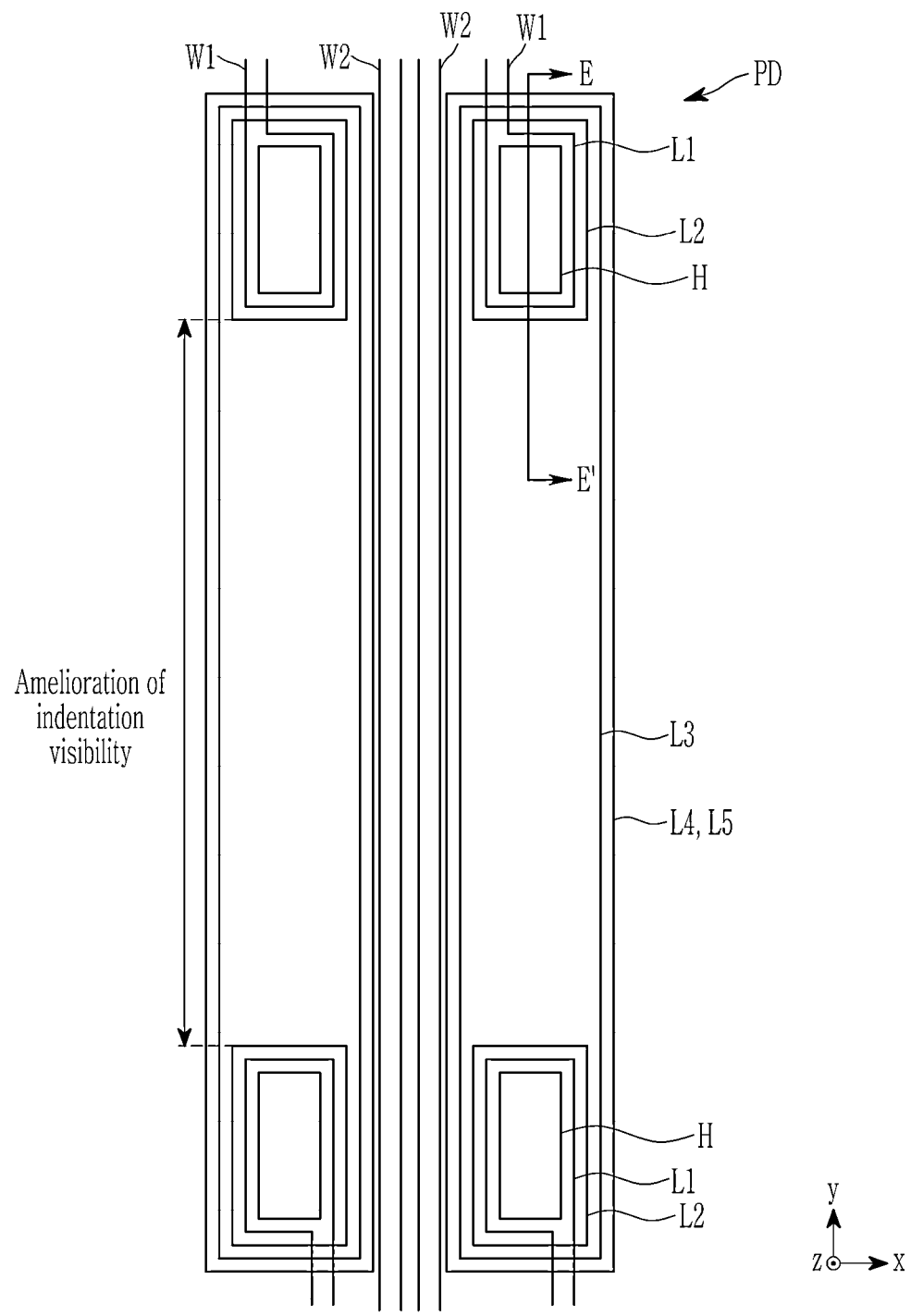
FIG. 13 illustrates a top plan view of a pad according to an embodiment.
Figure 14:
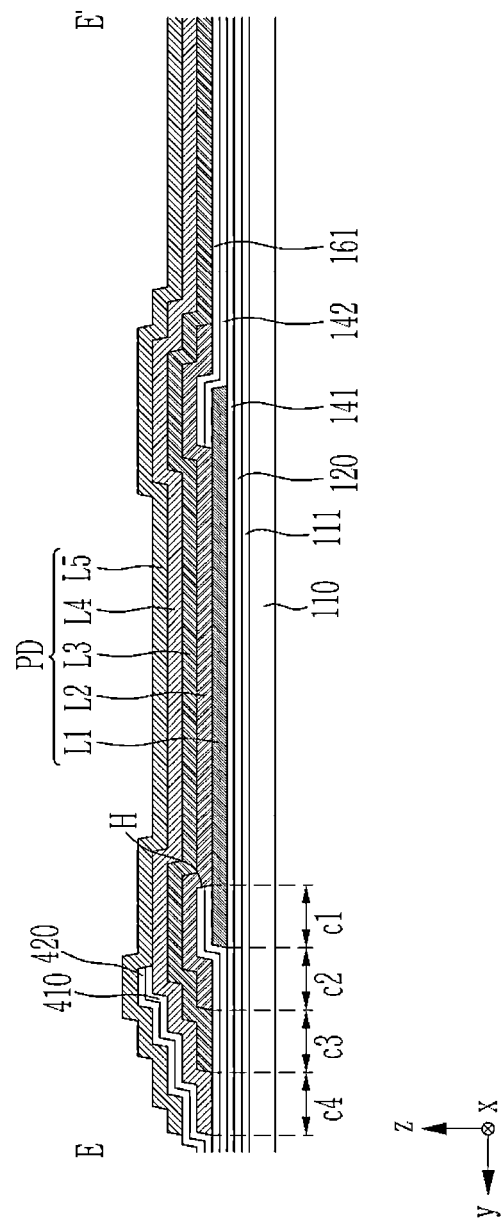
FIG. 14 illustrates a cross-sectional view taken along line E-E' of FIG. 13 according to an embodiment.

FIG. 13 illustrates a top plan view of a pad according to an embodiment, and FIG. 14 illustrates a cross-sectional view taken along line E-E' of FIG. 10 according to an embodiment.

The embodiment of FIGS. 13 and 14 is different from the embodiment of FIG. 6 in the first electrode layer L1, the second electrode layer L2, and an area where the contact hole H of the pad PD is formed.

The first electrode layer L1 and the second electrode layer L2 may be discontinuously disposed in the longitudinal direction of the pad PD. For example, the first electrode layer L1 and the second electrode layer L2 may be disposed at opposite sides of the pad PD in the longitudinal direction of the pad PD, but may not be disposed at a central portion of the pad PD. The contact hole H formed in the second gate insulating layer 142 and the first interlayer insulating layer 161 may also be positioned to overlap the first electrode layer L1 and the second electrode layer L2 at opposite sides of the pad PD in the longitudinal direction. The contact hole H may have various sizes and shapes, and may be, e.g., a rectangular shape having a width of about 3 μm to about 5 μm and a length of about 3 μm to about 13.5 μm.

It may be difficult to inspect a pressure mark for inspecting a compression state such as a position and a shape of conductive particles of an anisotropic conductive film that may be positioned between the pad PD and the bump after bonding of the integrated circuit chip 30 as the pad PD includes the first to fifth electrode layers L1 to L5. As in the present embodiment, the first electrode layer L1 and the second electrode layer L2 may not be positioned in a significant area of the pad PD by including the first electrode layer L1 and the second electrode layer L2 in which the pad PD is discontinuously formed. In such a region, since the pad PD includes the three overlapping electrode layers L3, L4, and L5, the indentation visibility may be ameliorated.

Figure 15:
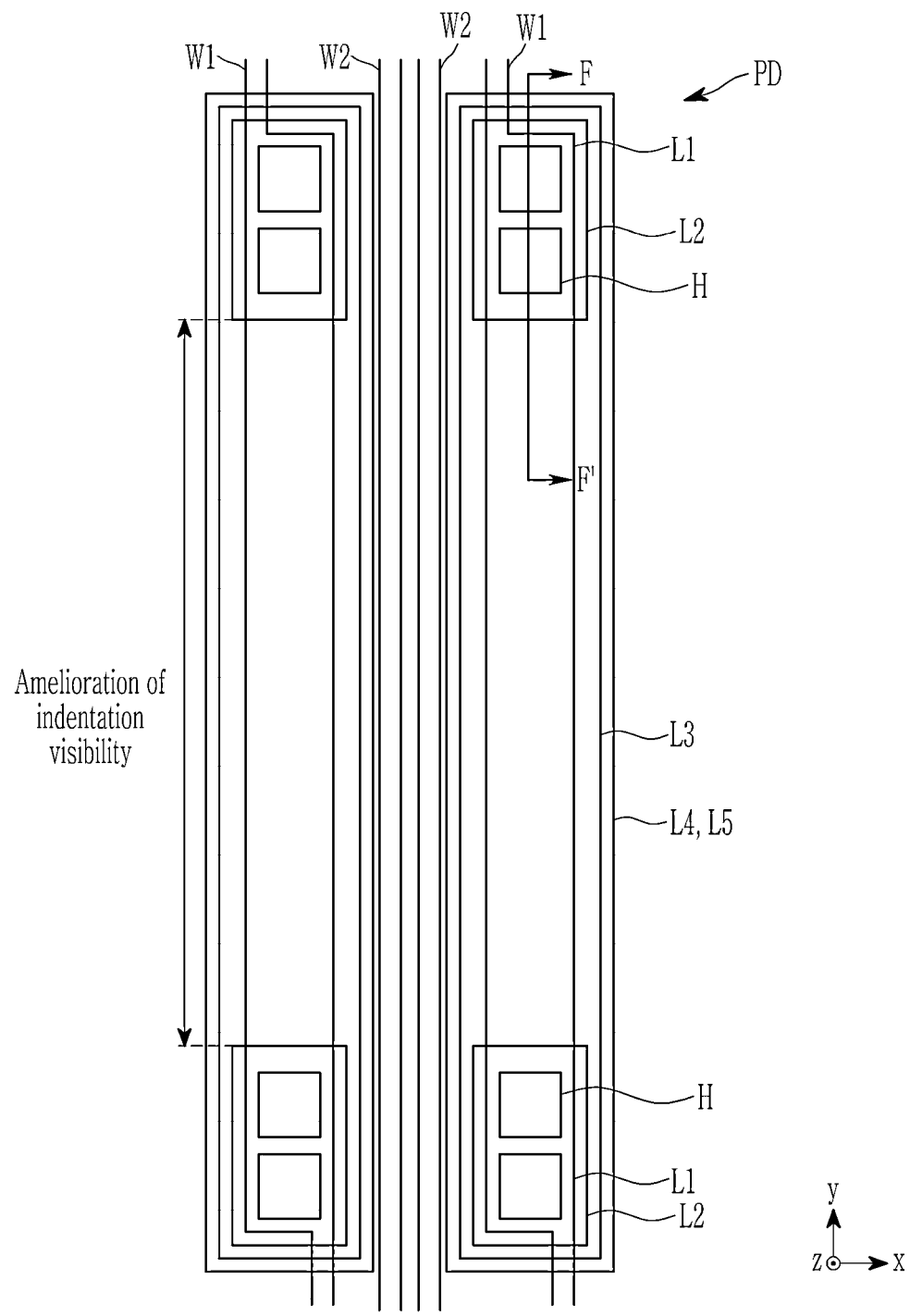
FIG. 15 illustrates a top plan view of a pad according to an embodiment.
Figure 16:
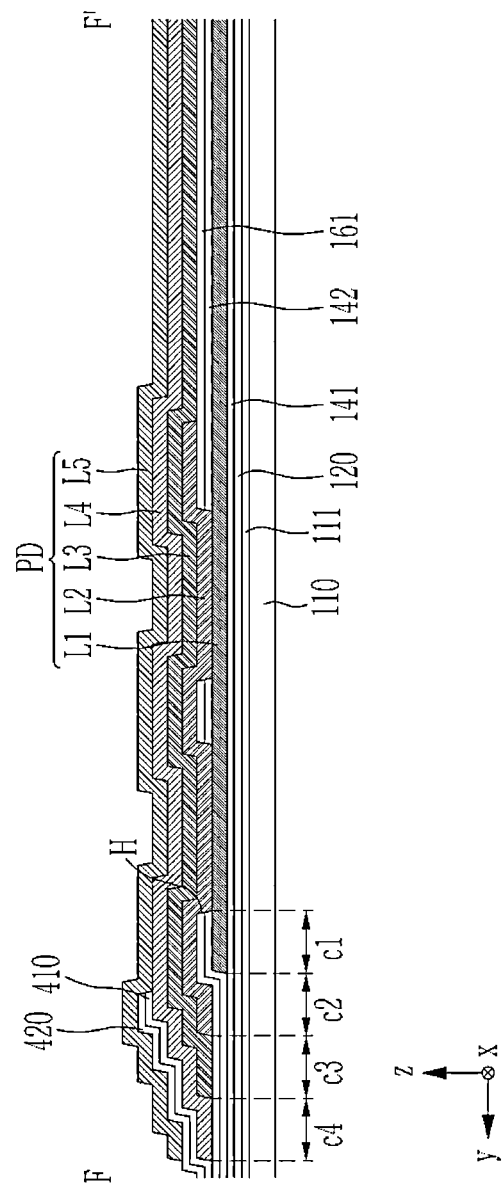
FIG. 16 illustrates a cross-sectional view taken along line F-F' of FIG. 15 according to an embodiment.

FIG. 15 illustrates a top plan view of a pad according to an embodiment, and FIG. 16 illustrates a cross-sectional view taken along line F-F' of FIG. 15 according to an embodiment.

The embodiment of FIG. 15 and FIG. 16 is different from the embodiment of FIG. 6 in the second electrode layer L2 and an area where the contact hole H of the pad PD is formed.

The first electrode layer L1 may be continuously disposed in the longitudinal direction of the pad PD, but the second electrode layer L2 may be discontinuously disposed in the longitudinal direction of the pad PD. For example, the second electrode layer L2 may be disposed at opposite sides of the pad PD in the longitudinal direction of the pad PD, but may not be disposed at a central portion of the pad PD. The contact hole H formed in the second gate insulating layer 142 and the first interlayer insulating layer 161 may also be positioned to overlap the second electrode layer L2 at opposite sides of the pad PD in the longitudinal direction. Although two contact holes H are illustrated at one side of the pad PD, one or three or more contact holes H may be formed.

The second electrode layer L2 may not be disposed in the significant area of the pad PD by including the second electrode layer L2 in which the pad PD is discontinuously formed. In such a region, since the pad PD includes the four overlapping electrode layers L1, L3, L4, and L5, the indentation visibility may be ameliorated.

In the meantime, the contact hole H illustrated in FIG. 11 to FIG. 16 may be formed in the first interlayer insulating layer 161 as illustrated in FIG. 7 depending on a cross-sectional position of the insulating layer or the first electrode layer L1 included in the display panel 10, may be formed in the second gate insulating layer 142, the first interlayer insulating layer 161, the third gate insulating layer 143, and the second interlayer insulating layer 162, or may be formed in the first interlayer insulating layer 161, the third gate insulating layer 143, and the second interlayer insulating layer 162.

Figure 17:
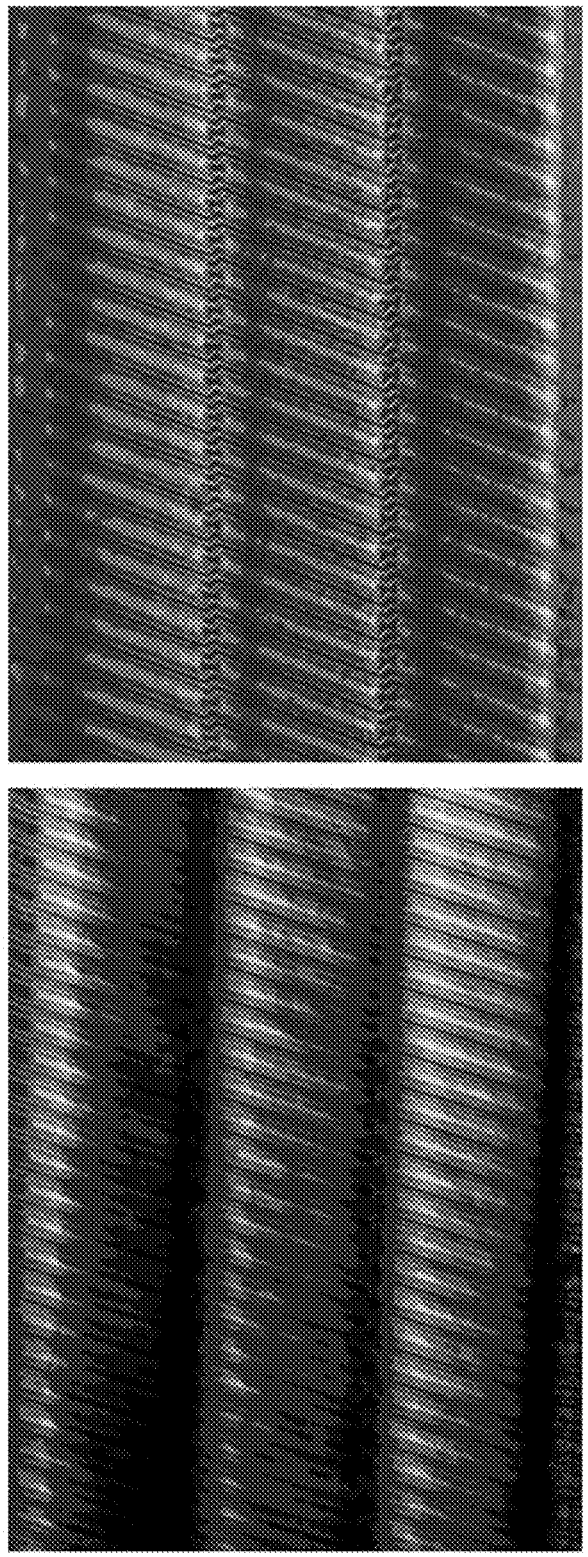
FIG. 17 illustrates an image showing indentation after bonding an integrated circuit chip to a pad portion.

FIG. 17 illustrates an image showing indentation after bonding an integrated circuit chip to a pad portion.

In FIG. 17, a left image shows an indentation in a pad including four electrode layers, and a right image shows an indentation in a pad including five electrode layers. In the left image, the indentation may be identified well, but in the right image, it is difficult to identify the indentation. As in the above-described embodiment, although the pad PD includes five electrode layers L1, L2, L3, L4, and L5, when the first electrode layer L1 and/or the second electrode layer L2 are discontinuously formed, the indentation may be identified in a region where four or less electrode layers overlap.

Figure 18:
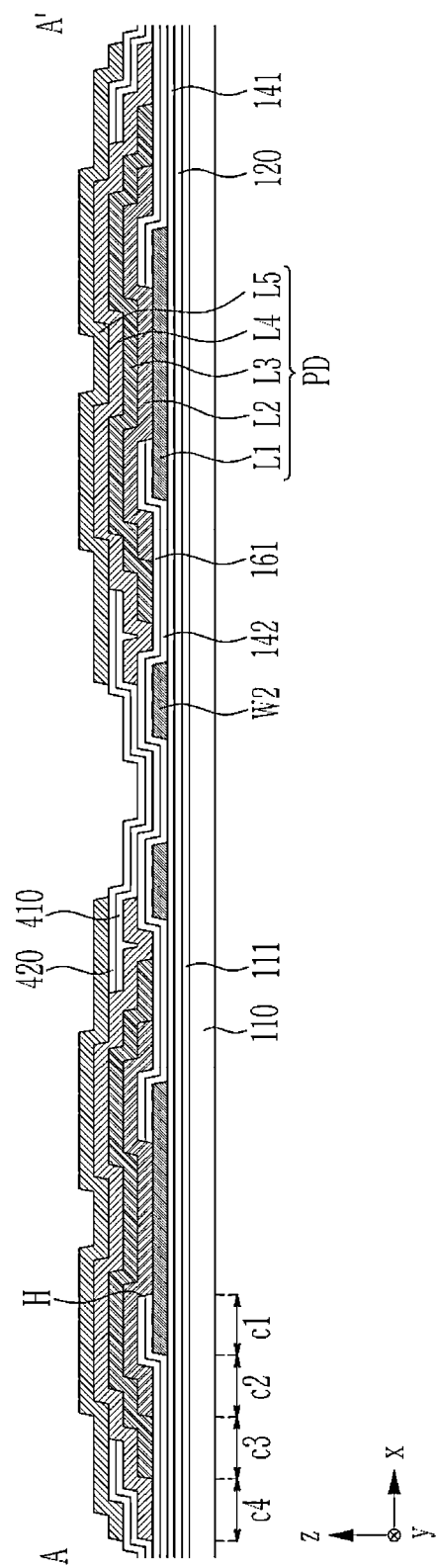
FIG. 18 illustrates a cross-sectional view of a pad according to an embodiment.

FIG. 18 illustrates a cross-sectional view of a pad according to an embodiment.

The embodiment of FIG. 18 is different from the embodiment of FIG. 6 in a region where the first insulating layer 410 and the second insulating layer 420 are formed.

Referring to FIG. 18, the first insulating layer 410 and the second insulating layer 420 may clad the edge of the fourth electrode layer L4. A cladding width may be smaller than a gap (c3+c4) between the edge of the fourth electrode layer L4 and the edge of the second electrode layer L2. For example, the first and second insulating layers 410 and 420 may be formed to overlap the third and fourth electrode layers L3 and L4 but to not overlap the second electrode layer L2.

When a step between the pad PD and an area between the pads PD increases, bonding reliability may deteriorate. As in the embodiment, when a formation region of the first and second insulating layers 410 and 420 is changed, a height of the pad PD may be lowered and a step difference may be reduced.

Figure 19:
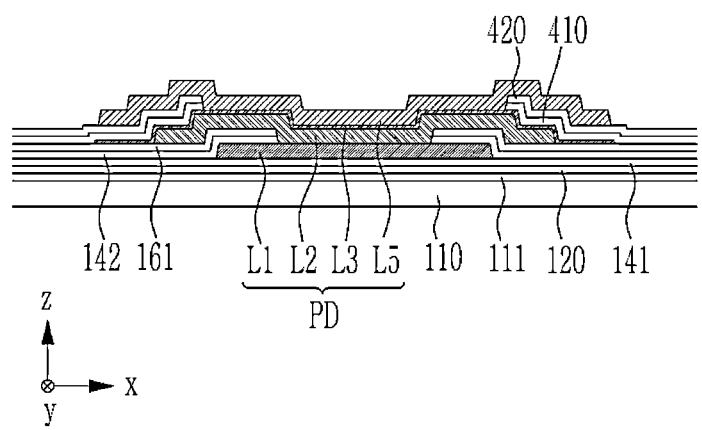
FIG. 19 illustrates a cross-sectional view of a pad according to an embodiment.

FIG. 19 illustrates a cross-sectional view of a pad according to an embodiment.

The embodiment of FIG. 19 is different from the embodiment of FIG. 6 in a configuration of the electrode layer included in the pad PD.

Referring to FIG. 19, the pad PD includes a first electrode layer L1, a second electrode layer L2, a third electrode layer L3, and a fifth electrode layer L5. An entire upper surface of the third electrode layer L3 may be in contact with a lower surface of the fourth electrode layer L5. As illustrated in FIG. 2 or FIG. 3, although the display area DA of the display panel 10 includes the first, second, and third data conductive layers, the pad PD may not include the fourth electrode layer L4 which is the third data conductive layer, unlike in the embodiment of FIG. 6. In addition, the pad PD includes a third electrode layer L3 corresponding to the second data conductive layer of the display area DA, but the third electrode layer L3 may have a thinner thickness than that of the second data conductive layer of the display area DA. The third electrode layer L3 included in the pad PD according to the embodiment of FIG. 19 may have a thinner thickness than that of the third electrode layer L3 included in the pad PD according to the embodiment of FIG. 6.

In this way, it is possible to reduce the step difference with the area between the pads PD, and to ameliorate the visibility of the indentation by allowing the pad PD to include four electrode layers L1, L2, L3, and L5 including the thinner third electrode layer L3.

When the second data conductive layer has a multilayer structure (e.g., a triple-layer structure of a refractory metal/low-resistance metal/refractory metal such as titanium/aluminum/titanium, or a double-layer structure of a refractory metal/low-resistance metal such as titanium/aluminum), a third electrode layer L3 that is a lower layer (e.g., a titanium layer) of the second data conductive layer may be positioned on the second electrode layer L2. The third electrode layer L3 may cover an entire upper surface of the second electrode layer L2. The second electrode layer L2 may be entirely covered up to a side surface of the second electrode layer L2 of the third electrode layer L3.

Figure 20:
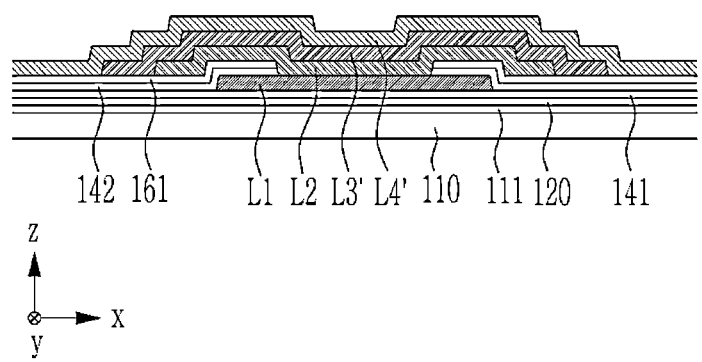
FIG. 20, FIG. 21, and FIG. 22 illustrate a cross-sectional view showing a manufacturing process of the pad illustrated in FIG. 19.
Figure 21:
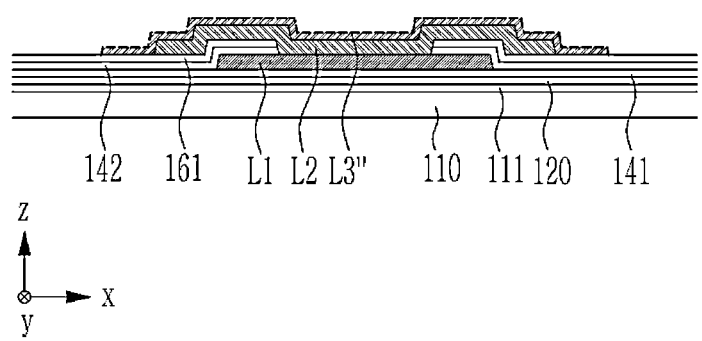
Figure 22:
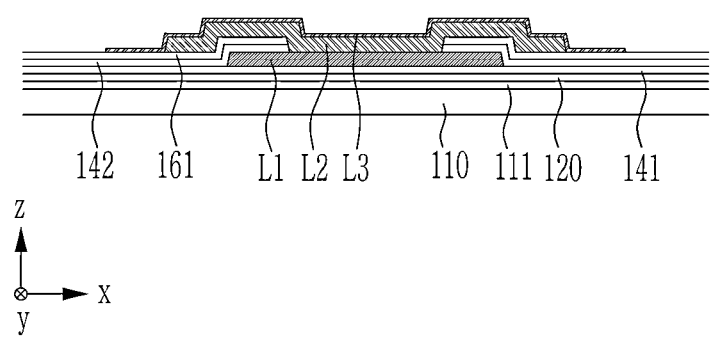

FIGS. 20, 21, and 22 illustrate a cross-sectional view showing a manufacturing process of the pad illustrated in FIG. 19.

The pad PD may be formed together when components of the display area DA are formed, and FIG. 2 is also referred to for a manufacturing process of the pad PD.

Referring to FIG. 2 and FIG. 20, the barrier layer 111 and the buffer layer 120 may be sequentially formed on the substrate 110, and the semiconductor layers A1 and A2 may be formed by depositing a semiconductor material thereon and then patterning it by a photolithography process. Hereinafter, patterning by the photolithography process is simply referred to as patterning.

Next, the gate electrodes G1 and G2 and the first electrode layer L1, which are first gate conductive layers, may be formed by forming the first gate insulating layer 141, depositing a conductive material thereon, and then patterning it. Next, the upper electrode C2 serving as a second gate conductive layer may be formed by forming the second gate insulating layer 142, depositing a metal material thereon, and then patterning it. As described above, the first electrode layer L1 may be the second gate conductive layer.

Next, the first electrodes S1 and S2, the second electrodes D1 and D2, and the second electrode layer L2, which are the first data conductive layers, may be formed by forming the first interlayer insulating layer 161, depositing a conductive material thereon, and then patterning it.

Next, the driving voltage line VL1 and the first connection electrode LE1 that are a second data conductive layer may be formed by forming the first planarization layer 181, depositing a conductive material thereon, and then patterning it. When the second data conductive layer is formed, a third electrode layer L3' covering the second electrode layer L2 may be formed on the pad portion PP2 while the first planarization layer 181 is removed. The formed third electrode layer L3' may have a same thickness as the driving voltage line VL1, etc.

Next, the data line DL and the second connection electrode LE2 serving as a third data conductive layer may be formed by forming the second planarization layer 182, depositing a conductive material thereon, and then patterning it. When the conductive material is stacked to form the third data conductive layer, a fourth electrode layer L4' covering the third electrode layer L3' may be formed on the pad portion PP2 while the second planarization layer 182 is removed.

Referring to FIG. 2 and FIG. 21, when the conductive material layer is patterned to form the third data conductive layer, the fourth electrode layer L4' on the third electrode layer L3' may be entirely etched, and a portion of the third electrode layer L3' may also be etched to form a reduced third electrode layer L3" having a reduced thickness. For example, when the third electrode layer L3' is a triple layer of titanium/aluminum/titanium (Ti/Al/Ti), the entire upper titanium layer and a portion of the aluminum layer may be etched during dry etching to form the third data conductive layer. The third electrode layer L3' may be etched from about 30% to about 70%, e.g., about half of a total thickness, and as a result, the reduced third electrode layer L3" may have a thickness of about 30% to about 70% of the thickness of the driving voltage line VL1 and the like. For example, the thickness of the third electrode layer L3' may be about 6800 Å, and the thickness of the reduced third electrode layer L3" may be about 2800 Å.

Referring to FIG. 2 and FIG. 22, the pixel electrode 191 may be formed by forming the third planarization layer 183, depositing a conductive material thereon, and then patterning it. When patterning is performed to form the pixel electrode 191, the remaining reduced third electrode layer L3" may be etched in the pad portion PP2. For example, when the reduced third electrode layer L3" is a double layer of titanium/aluminum (Ti/Al), an aluminum layer may be entirely etched during wet etching to form the pixel electrode 191, and a lower titanium layer may not be etched. Accordingly, in the third electrode layer L3' of the triple layer of titanium/aluminum/titanium (Ti/Al/Ti), a lower titanium layer may remain on the second electrode layer L2 to form the third electrode layer L3 of the pad PD. The thickness of the third electrode layer L3 may be about 100 Å to about 500 Å, or about 200 Å to about 400 Å, e.g., about 300 Å. As such, the thin third electrode layer L3 may be formed by increasing an etching time during etching for forming the third data conductive layer and etching for forming the pixel electrode 191.

Next, the pixel definition layer 360, the emission layers 370A, 370B, and 370C, the common electrode 270, and the encapsulation layer 390 may be formed in the display area DA. Next, the bridge 452 serving as the first touch conductive layer may be formed by forming the first insulating layer 410, depositing a conductive material thereon, and then patterning it. When patterning is performed to form the first touch conductive layer, the first insulating layer 410 may cover the third electrode layer L3 in the pad portion PP2.

Next, the touch electrode 451 as the second touch conductive layer and the fifth electrode layer L5 may be formed by forming the second insulating layer 420, depositing a conductive material thereon, and then patterning it. Before deposition of a conductive material for formation of the second touch conductive layer, the first and second insulating layers 410 and 420 may be etched to expose an upper surface of the third electrode layer L3 while cladding edges of the second electrode layer L2 and the third electrode layer L3. Accordingly, the fourth electrode layer L5 may contact an upper surface of the third electrode layer L3.

Next, the passivation layer 430, the light blocking layer 520, the color filters 530A, 530B, and 530C, and the overcoat layer 540 may be formed in the display area DA. By this process, the display area DA has the structure illustrated in FIG. 2, and the display panel 10 having the structure illustrated in FIG. 19 may be manufactured by the pad portion PP2.

Meanwhile, the display panel 10 in which the pad PD includes the first to fifth electrode layers L1, L2, L3, L4, and L5 may be manufactured by forming the corresponding first to fifth electrode layers L1, L2, L3, L4, and L5 during patterning for forming the first and second gate conductive layers and the first to third data conductive layers of the display area DA.

Figure 23:
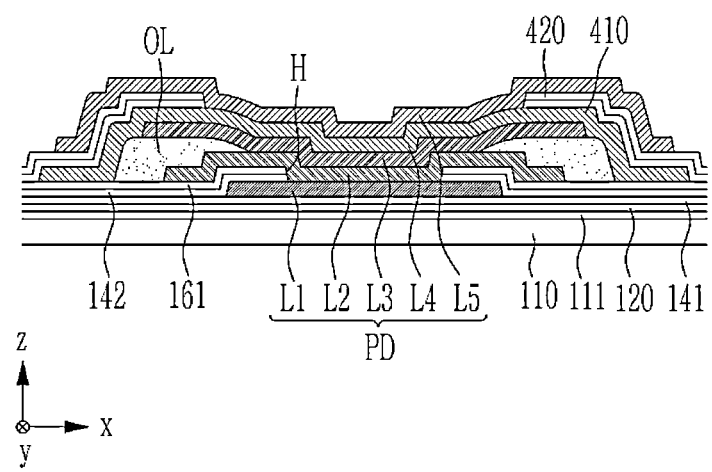
FIG. 23 illustrates a cross-sectional view of a pad according to an embodiment.

FIG. 23 illustrates a cross-sectional view of a pad according to an embodiment.

The embodiment of FIG. 23 is different from the embodiment of FIG. 6 in that an organic layer OL is positioned between the second electrode layer L2 and the third electrode layer L3. The organic layer OL may be disposed between the second electrode layer L2 and the third electrode layer L3, and may clad the edge of the second electrode layer L2. The organic layer OL may be the first planarization layer 181 disposed in the display area DA. For example, the organic layer OL may be formed together with the first planarization layer 181, a contact hole of the first planarization layer 181, and the like by applying an organic insulating material over the display area DA and the pad part PP2 and then patterning it after forming the first data conductive layer. Accordingly, an additional process for forming the organic layer OL and an additional mask are not required.

An organic layer cladding an edge of the third electrode layer L3 and/or an organic layer cladding an edge of the fourth electrode layer L4 may be disposed in place of or in addition to the illustrated organic layer OL. The organic layer cladding the edge of the third electrode layer L3 may be the second planarization layer 182 disposed in the display area DA. The organic layer cladding the edge of the fourth electrode layer L4 may be the third planarization layer 183 and/or the pixel definition layer 360 disposed in the display area DA.

As such, when the organic layer OL overlapping the pad PD is disposed on the pad part PP2, during pressing for bonding of the integrated circuit chip 30, etc., the organic layer OL may buffer or accommodate the force applied to the pad PD, thereby suppressing cracks in the pad PD and the insulating layers 111, 120, 141, 142, and 161. The organic layer OL may functionally be a crack suppression layer. Since the organic layer OL has a smaller modulus than the metal layer or the inorganic layer, a stress on strain is small, so it is strong against cracks and can withstand shrinkage well.

Figure 24:
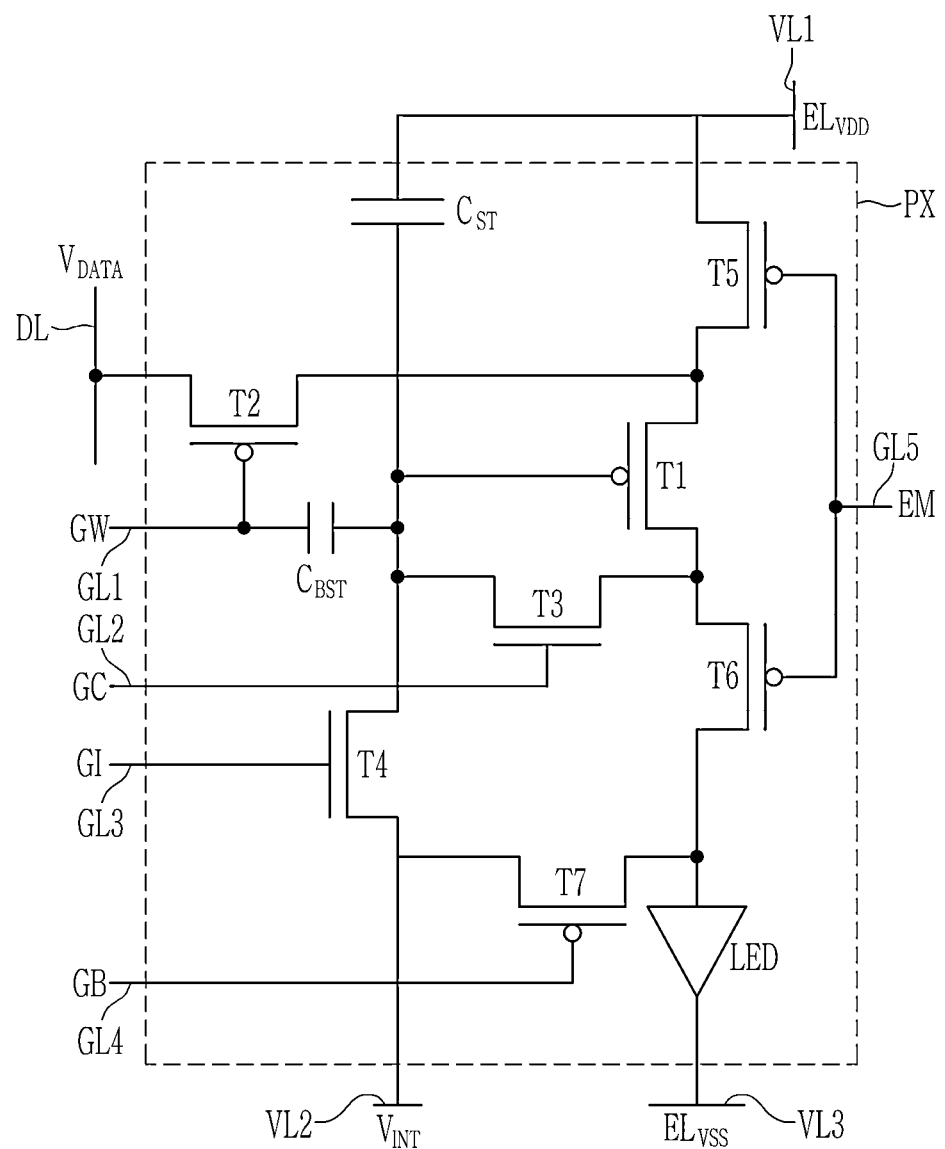
FIG. 24 illustrates an equivalent circuit diagram of a pixel of a display device according to an embodiment.

FIG. 24 illustrates an equivalent circuit diagram of a pixel of a display device according to an embodiment.

One pixel PX may include transistors T1, T2, T3, T4, T5, T6, and T7, a storage capacitor $C_{ST}$, a boost capacitor $C_{BST}$, and a light emitting element LED which may be a light emitting diode, connected to several signal lines GL1, GL2, GL3, GL4, and GL5, DL, and VL1, VL2, and VL3.

The signal lines GL1, GL2, GL3, GL4, and GL5, DL, and VL1, VL2, and VL3 may include gate lines GL1, GL2, GL3, GL4, and GL5, a data line DL, and voltage lines VL1, VL2, and VL3. The gate lines GL1, GL2, GL3, GL4, and GL5 may be electrically connected to the gate driver, and the data line DL may be electrically connected to the data driver. The gate lines GL1, GL2, GL3, GL4, and GL5 may include a scan line GL1, an inverted scan line GL2, an initialization control line GL3, a bypass control line GL4, and an emission control line GL5. The voltage lines VL1, VL2, and VL3 may include a driving voltage line VL1, an initialization voltage line VL2, and a common voltage line VL3. The driving voltage line VL1, the initialization voltage line VL2, and the common voltage line VL3 may each be connected to a voltage generator. Each of the voltage lines VL1, VL2, and VL3 may be included in at least one of the above-described first data conductive layer, second data conductive layer, or third data conductive layer.

The second to seventh transistors T2, T3, T4, T5, T6, and T7 may receive respective gate signals through the gate lines GL1, GL2, GL3, GL4, and GL5.

The scan line GL1 may transfer a scan signal GW to the second transistor T2. The inverted scan line GL2 may transfer an inverted scan signal GC to the third transistor T3. The scan signal GW and the inverted scan signal GC may have opposite polarities. For example, when a high voltage is applied to the scan line GL1, a low voltage may be applied to the inverted scan line GL2.

The initialization control line GL3 may transfer an initialization control signal GI to the fourth transistor T4. The bypass control line GL4 may transfer the bypass signal GB to the seventh transistor T7. The bypass control line GL4 may be the line GL1 connected to the pixel PX that is adjacent in the second direction y. The emission control line GL5 may transfer the emission control signal EM to the fifth transistor T5 and the sixth transistor T6.

The data line DL may transfer the data voltage VDATA. The driving voltage line VL1 may transfer the driving voltage $EL_{VDD}$, the initialization voltage line VL2 may transfer the initialization voltage $V_{INT}$, and the common voltage line VL3 may transfer the common voltage $EL_{VSS}$ Luminance of the light emitting element LED may be adjusted depending on a magnitude of the data voltage VDATA applied to the pixel PX. Each of the driving voltage $EL_{VDD}$, the initialization voltage $V_{INT}$, and the common voltage $EL_{VSS}$ may be a DC voltage having a predetermined level.

For the transistors T1, T2, T3, T4, T5, T6, and T7, the first transistor T1 serving as the driving transistor may be a p-type transistor, and may include a polycrystalline semiconductor. It is a transistor that adjusts a level of a driving current outputted to an anode of the light emitting element LED depending on the data voltage V DATA applied to the gate electrode of the first transistor T1. A gate electrode of the first transistor T1 may be connected to a first electrode of the storage capacitor $C_{ST}$. A first electrode of the first transistor T1 is connected to the second electrode of the second transistor T2, and is connected to the driving voltage line VL1 via the fifth transistor T5. A second electrode of the first transistor T1 is connected to the anode of the light emitting element LED via the sixth transistor T6.

The second transistor T2, which is a switching transistor, may be a p-type transistor and may include a polycrystalline semiconductor. A gate electrode of the second transistor T2 is connected to the scan line GL1, and is connected to a first electrode of a boost capacitor $C_{BST}$. A first electrode of the second transistor T2 is connected to the data line DL, and a second electrode of the second transistor T2 is connected to the first electrode of the first transistor T1. When the second transistor T2 is turned on by a gate-on voltage (low voltage) of the scan signal GW transferred through the scan line GL1, the data voltage VDATA transferred through the data line DL may be transferred to the first electrode of the first transistor T1.

The third transistor T3, which is a compensation transistor, may be an n-type transistor, and may include an oxide semiconductor. The third transistor T3 may electrically connect the second electrode and the gate electrode of the first transistor T1 to each other. As a result, a compensation voltage to which the data voltage VDATA is changed through the first transistor T1 may be transferred to the first electrode of the storage capacitor $C_{ST}$. A gate electrode of the third transistor T3 is connected to the inverted scan line GL2, and a first electrode of the third transistor T3 is connected to the second electrode of the first transistor T1. A second electrode of the third transistor T3 is connected to the first electrode of the storage capacitor $C_{ST}$, the gate electrode of the first transistor T1, and the second electrode of the boost capacitor $C_{BST}$. When the third transistor T3 is turned on by a gate-on voltage (high voltage) of the inverted scan signal GC that is received through the inverted scan line GL2, the third transistor T3 connects the gate electrode of the first transistor T1 and the second electrode of the first transistor T1. A voltage applied to the gate electrode of the first transistor T1 is stored in the storage capacitor $C_{ST}$, and the storage capacitor $C_{ST}$ may constantly maintain a voltage of the gate electrode of the first transistor T1 for one frame.

The fourth transistor T4, which is an initialization transistor, may be an n-type transistor, and may include an oxide semiconductor. A gate electrode of the fourth transistor T4 is connected to the initialization control line GL3. The fourth transistor T4 may initialize the gate electrode of the first transistor T1 and the first electrode of the storage capacitor $C_{ST}$ to the initialization voltage $V_{INT}$. The gate electrode of the fourth transistor T4 is connected to the initialization control line GL3, and a first electrode of the fourth transistor T4 is connected to the initialization voltage line VL2. A second electrode of the fourth transistor T4 is connected to the first electrode of the storage capacitor $C_{ST}$, the gate electrode of the first transistor T1, and the second electrode of the boost capacitor $C_{BST}$. The fourth transistor T4 may be turned on by a gate-on voltage (high voltage) of the initialization control signal GI that is received through the initialization control line GL3, and the initialization voltage $V_{INT}$ may be transferred to the gate electrode of the first transistor T1 and the first electrode of the storage capacitor $C_{ST}$.

The fifth transistor T5, which is an operation control transistor, may be a p-type transistor and may include a polycrystalline semiconductor. The fifth transistor T5 may transfer the driving voltage $EL_{VDD}$ to the first transistor T1. A gate electrode of the fifth transistor T5 is connected to the emission control line GL5, a first electrode of the fifth transistor T5 is connected to the driving voltage line VL1, and a second electrode of the fifth transistor T5 is connected to the first electrode of the first transistor T1. The sixth transistor T6, which is an emission control transistor, may be a p-type transistor and may include a polycrystalline semiconductor. The sixth transistor T6 may transfer the driving current that is outputted from the first transistor T1 to the light emitting element LED. The gate electrode of the sixth transistor T6 is connected to the emission control line GL5, a first electrode of the sixth transistor T6 is connected to the second electrode of the first transistor T1, and a second electrode of the sixth transistor T6 is connected to the anode of the light emitting element LED.

The seventh transistor T7, which is a bypass transistor, may be a p-type transistor and may include a polycrystalline semiconductor. The seventh transistor T7 may initialize the anode of the light emitting element LED. A gate electrode of the seventh transistor T7 is connected to the bypass control line GL4, a first electrode of the seventh transistor T7 is connected to the anode of the light emitting element LED, and a second electrode of the seventh transistor T7 is connected to the initialization voltage line VL2. When the seventh transistor T7 is turned on by the gate-on voltage (low voltage) of the bypass signal GB, the initialization voltage $V_{INT}$ may be applied to the anode of the light emitting element LED.

The second electrode of the storage capacitor $C_{ST}$ is connected to the driving voltage line VL1. The cathode of the light emitting element LED is connected to the common voltage line VL3 that transfers the common voltage $EL_{VSS}$.

A low voltage may be applied to the inverted scan line GL2 when a high voltage is applied to the scan line GL1, and a high voltage may be applied to the inverted scan line GL2 when a low voltage is applied to the scan line GL1. Since the inverted scan signal GC applied to the inverted scan line GL2 is inverted from the scan signal GW applied to the scan line GL1, the gate voltage of the first transistor T1 may be reduced after a data voltage is written. Conversely, the scan signal GW may increase the gate voltage of the first transistor T1. The boost capacitor $C_{BST}$ is positioned between the scan line GL1 and the gate electrode of the first transistor T1, so that the gate voltage of the first transistor T1 may be stabilized. The boost capacitor $C_{BST}$ may compensate for an increase or decrease of the gate voltage of the first transistor T1 when the inverted scan signal GC is changed to a high voltage or a low voltage.

Unlike the illustrated embodiment, the third transistor T3 and the fourth transistor T4 may also include a polycrystalline semiconductor, and may be a p-type transistor. In this case, the second transistor T2 and the third transistor T3 may receive a same gate signal, and the pixel PX may not include the boost capacitor $C_{BST}$.

In the illustrated embodiment, the pixel PX includes seven transistors T1 to T7 and one storage capacitor $C_{ST}$, and one boost capacitor $C_{BST}$, but a number of transistors, a number of capacitors, and a connection relationship thereof may be variously changed.

While the present disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising;
    a substrate including a display area and a non-display area; and
    a plurality of pads disposed in the non-display area,
    wherein each of the pads includes a first electrode layer, a second electrode layer, a third electrode layer, a fourth electrode layer, and a fifth electrode layer which are sequentially disposed on the substrate,
    a first insulating layer and a second insulating layer which clad an edge of the fourth electrode layer and are disposed between the fourth electrode layer and the fifth electrode layer, and
    the second electrode layer is in contact with the first electrode layer by a contact hole penetrating through at least one insulating layer.

2. The display device of claim 1, wherein
the third electrode layer entirely covers the second electrode layer, and the fourth electrode layer entirely covers the third electrode layer.
3. The display device of claim 1, wherein
an insulating layer is not disposed between the second electrode layer and the third electrode layer, and an insulating layer is not disposed between the third electrode layer and the fourth electrode layer.
4. The display device of claim 1, wherein
the fifth electrode layer is disposed on the first insulating layer and the second insulating layer, and
the fifth electrode layer is in contact with an upper surface of the fourth electrode layer which is not clad by the first insulating layer and the second insulating layer.
5. The display device of claim 4, wherein
an edge of the fifth electrode layer is aligned with an edge of the fourth electrode layer.
6. The display device of claim 1, further comprising:
a semiconductor layer disposed in the display area of the substrate;
a first gate insulating layer disposed on the semiconductor layer;
a first gate conductive layer disposed on the first gate insulating layer;
a second gate insulating layer disposed on the first gate conductive layers;
a second gate conductive layer disposed on the second gate insulating layer;
a first interlayer insulating layer disposed on the second gate conductive layers;
a first data conductive layer disposed on the first interlayer insulating layer;
a first planarization layer disposed on the first data conductive layer;
a second data conductive layer disposed on the first planarization layer;
a second planarization layer disposed on the second data conductive layer; and
a third data conductive layer disposed on the second planarization layer,
wherein at least one of the first gate conductive layer and the second gate conductive layer includes the first electrode layer, and
each of the first data conductive layer, the second data conductive layer, and the third data conductive layer includes the second electrode layer, the third electrode layer, and the fourth electrode layer.
7. The display device of claim 6, further comprising:
a third planarization layer disposed on the third data conductive layer;
a light emitting diode disposed on the third planarization layer;
an encapsulation layer disposed on the light emitting diode;
a first insulating layer disposed on the encapsulation layer;
a first touch conductive layer disposed on the first insulating layer;
a second insulating layer disposed on the first touch conductive layer; and
a second touch conductive layer disposed on the second insulating layer,
wherein the second touch conductive layer includes the fifth electrode layer.

8. The display device of claim 1, wherein
the pads include a first pad and a second pad which are adjacent in a first direction,
the display device further includes a wire connected to a pad disposed in an array that is different from that of the first pad and the second pad, and disposed between the first pad and the second pad, and
at least one of the first pad and the second pad overlaps the wire.
9. The display device of claim 1, wherein
the pads include a first pad and a second pad which are adjacent in a first direction,
the display device further includes a wire connected to a pad disposed in an array that is different from that of the first pad and the second pad, and disposed between the first pad and the second pad, and
the first pad and the second pad do not overlap the wire.
10. The display device of claim 1, wherein
the first electrode layer and the second electrode layer are discontinuously disposed in a longitudinal direction of the pad.
11. The display device of claim 10, wherein
the first electrode layer and the second electrode layer are disposed to overlap opposite sides of the pad in the longitudinal direction of the pad, and are not disposed in a central portion of the pad.
12. The display device of claim 1, wherein
the second electrode layer is discontinuously disposed in a longitudinal direction of the pad.
13. The display device of claim 12, wherein
the second electrode layer is disposed at opposite sides of the pad in the longitudinal direction of the pad, and is not disposed in a central portion of the pad.
14. The display device of claim 12, wherein
the contact hole is provided in plural at one side of the pad.
15. The display device of claim 1, further comprising
a first insulating layer and a second insulating layer which clad an edge of the fourth electrode layer,
wherein the first insulating layer and the second insulating layer do not overlap the second electrode layer.
16. The display device of claim 1, further comprising
an organic layer which clads an edge of the second electrode layer.
17. A display device comprising:
a substrate including a display area and a non-display area;
a semiconductor layer disposed in the display area of the substrate;
a first gate conductive layer disposed on the semiconductor layer;
a second gate conductive layer disposed on the first gate conductive layer;
a first data conductive layer disposed on the second gate conductive layer;
a second data conductive layer disposed on the first data conductive layer;
a third data conductive layer disposed on the second data conductive layer;
a first touch conductive layer disposed on the third data conductive layer;
a second touch conductive layer disposed on the first touch conductive layer; and
a pad disposed in the non-display area,
wherein the pad includes a first electrode layer, a second electrode layer, a third electrode layer, a fourth electrode layer, and a fifth electrode layer which are sequentially disposed on the substrate, the first gate conductive layer or the second gate conductive layer includes the first electrode layer, the first data conductive layer includes the second electrode layer, and the second touch conductive layer includes the fourth electrode layer, a first insulating layer and a second insulating layer which clad an edge of the fourth electrode layer and are disposed between the fourth electrode layer and the fifth electrode layer, and the second electrode layer is in contact with the first electrode layer by a contact hole penetrating through at least one insulating layer.

18. The display device of claim 17, wherein the third data conductive layer includes a plurality of layers, and the third electrode layer includes only a lower layer among the layers of the third data conductive layer.

19. The display device of claim 18, wherein a lower surface of the third electrode layer is in contact with an upper surface of the second electrode layer, and an upper surface of the third electrode layer is in contact with a lower surface of the fourth electrode layer.

20. The display device of claim 17, further comprising a first insulating layer and a second insulating layer which clad edges of the second electrode layer and the third electrode layer, wherein the fourth electrode layer is disposed on the first insulating layer and the second insulating layer, and the fourth electrode layer is in contact with an upper surface of the third electrode layer which is not clad by the first insulating layer and the second insulating layer.

* * * * *